United States Patent
Tanaka

(10) Patent No.: US 12,402,245 B2
(45) Date of Patent: Aug. 26, 2025

(54) RADIO-FREQUENCY MODULE AND COMMUNICATION DEVICE

(71) Applicant: Murata Manufacturing Co., Ltd., Kyoto (JP)

(72) Inventor: Rui Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 265 days.

(21) Appl. No.: 18/187,231

(22) Filed: Mar. 21, 2023

(65) Prior Publication Data

US 2023/0240000 A1 Jul. 27, 2023

Related U.S. Application Data

(63) Continuation of application No. PCT/JP2021/040194, filed on Nov. 1, 2021.

(30) Foreign Application Priority Data

Nov. 2, 2020 (JP) .................................. 2020-183885

(51) Int. Cl.
*H05K 1/02* (2006.01)
*H03H 9/13* (2006.01)
*H03H 9/54* (2006.01)

(52) U.S. Cl.
CPC ........... *H05K 1/0243* (2013.01); *H03H 9/133* (2013.01); *H03H 9/54* (2013.01); *H05K 1/0216* (2013.01); *H05K 2201/1006* (2013.01)

(58) Field of Classification Search
CPC ............... H05K 1/0243; H05K 1/0216; H05K 2201/1006; H03H 9/133; H03H 9/54
See application file for complete search history.

(56) References Cited

U.S. PATENT DOCUMENTS

| 9,461,001 B1* | 10/2016 | Tsai ................... H01L 25/0655 |
| 11,201,602 B1* | 12/2021 | Oran .................... H01L 23/66 |
| 2017/0133998 A1* | 5/2017 | Hino ...................... H03F 3/19 |

(Continued)

FOREIGN PATENT DOCUMENTS

| JP | 2005-094405 A | 4/2005 |
| WO | 2016/080333 A1 | 5/2016 |

(Continued)

OTHER PUBLICATIONS

International Search Report for PCT/JP2021/040194 dated Jan. 25, 2022.

*Primary Examiner* — Hoa C Nguyen

(74) *Attorney, Agent, or Firm* — McDonald Hopkins LLC

(57) ABSTRACT

A radio-frequency module includes a mounting substrate, a first filter, a second filter, a shield layer, and a conductor. The mounting substrate has a first main surface and a second main surface on opposite sides. The shield layer is disposed on an outer surface of a resin layer with which the first filter and the second filter are covered. The radio-frequency module is capable of performing simultaneous transmission by using both the first filter and the second filter. The conductor is disposed on the first main surface of the mounting substrate and is in contact with the transmitting filter and the mounting substrate. The conductor is in contact with the shield layer on a side other than a side closer to the second filter than to the first filter.

20 Claims, 13 Drawing Sheets

(56) References Cited

U.S. PATENT DOCUMENTS

| | | |
|---|---|---|
| 2017/0256474 A1 | 9/2017 | Fujinaga |
| 2017/0302328 A1 | 10/2017 | Obiya et al. |
| 2017/0317002 A1* | 11/2017 | Kitahara ............. H01L 23/3677 |
| 2019/0081380 A1* | 3/2019 | Bates .................. H01L 23/5387 |
| 2020/0091608 A1* | 3/2020 | Alpman .................... H01Q 1/48 |
| 2021/0099190 A1* | 4/2021 | Uejima .................... H03F 3/72 |
| 2021/0099191 A1 | 4/2021 | Uejima |

FOREIGN PATENT DOCUMENTS

| | | |
|---|---|---|
| WO | 2016/117196 A1 | 7/2016 |
| WO | 2016/117482 A1 | 7/2016 |
| WO | 2019/244816 A1 | 12/2019 |

\* cited by examiner

RADIO-FREQUENCY MODULE AND COMMUNICATION DEVICE

CROSS REFERENCE TO RELATED APPLICATION

This is a continuation of International Application No. PCT/JP2021/040194 filed on Nov. 1, 2021 which claims priority from Japanese Patent Application No. 2020-183885 filed on Nov. 2, 2020. The contents of these applications are incorporated herein by reference in their entireties.

BACKGROUND ART

Technical Field

The present disclosure relates to a radio-frequency module and a communication device and, more specifically, to a radio-frequency module including a first filter and a second filter and to a communication device including the radio-frequency module.

A radio-frequency power-amplifying module (radio-frequency module) including two transmitting filters (a first filter and a second filter) whose passbands are different communication bands is disclosed in Patent Document 1. The two transmitting filters of the radio-frequency power-amplifying module can work concurrently.

Patent Document 1: International Publication No. 2016/117482

BRIEF SUMMARY

When the radio-frequency power-amplifying module disclosed in Patent Document 1 performs simultaneous transmission by using both a first transmitting filter (first filter) and a second transmitting filter (second filter), heat generated by the first transmitting filter (first filter) affects the second transmitting filter (second filter). This can cause deterioration of the characteristics of the second transmitting filter.

The present disclosure provides a radio-frequency module and a communication device that are capable of eliminating or reducing the possibility that heat generated by a first filter of the radio-frequency module will cause deterioration of the characteristics of a second filter of the radio-frequency module while both the first filter and the second filter are used for simultaneous transmission.

According to an aspect of the present disclosure, a radio-frequency module includes a mounting substrate, a first filter, a second filter, a resin layer, a shield layer, and a conductor. The mounting substrate has a first main surface and a second main surface on opposite sides. The first filter is mounted on the first main surface of the mounting substrate and is a filter whose passband is a first frequency band. The second filter is mounted on the first main surface of the mounting substrate and is a filter whose passband is a second frequency band. The resin layer is disposed on the first main surface of the substrate. The first and second filters are at least partially covered with the resin layer. The shield layer is disposed on an outer surface of the resin layer. The conductor is disposed on the first main surface of the substrate and is in contact with the first filter and the substrate. The shield layer is disposed on the outer surface of the resin layer. The radio-frequency module is capable of performing simultaneous transmission by using both the first filter and the second filter. The conductor is in contact with the shield layer on a side other than a side closer to the second filter than to the first filter.

According to an aspect of the present disclosure, a communication device includes the radio-frequency module according to the aforementioned aspect and a signal processing circuit. The signal processing circuit is connected to the radio-frequency module and is configured to process a radio-frequency signal.

The radio-frequency module and the communication device according to the present disclosure are capable of eliminating or reducing the possibility that heat generated by the first filter of the radio-frequency module will cause deterioration of the characteristics of the second filter of the radio-frequency module while both the first filter and the second filter are used for simultaneous transmission.

DETAILED DESCRIPTION

FIGS. 1 to 13, which will be referred to in relation to, for example, the following embodiment, are schematic views, in which constituent components are not drawn to scale and the size and thickness ratios thereof do not necessarily fully correspond to the actual dimension ratios.

Embodiment (1) Overview

Figure 4:
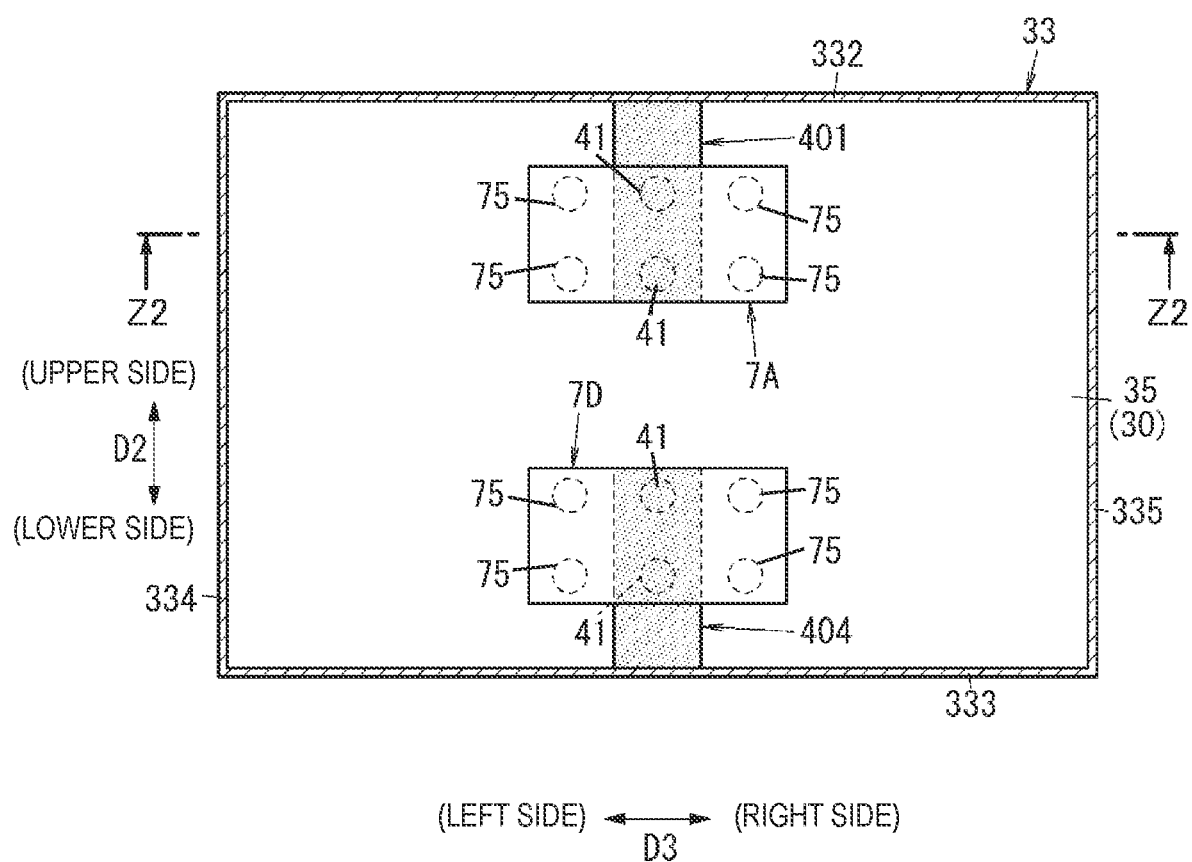
FIG. 4 is a plan view and illustrates an arrangement of two transmitting filters capable of working concurrently and conductors provided for the respective transmitting filters.
Figure 5:
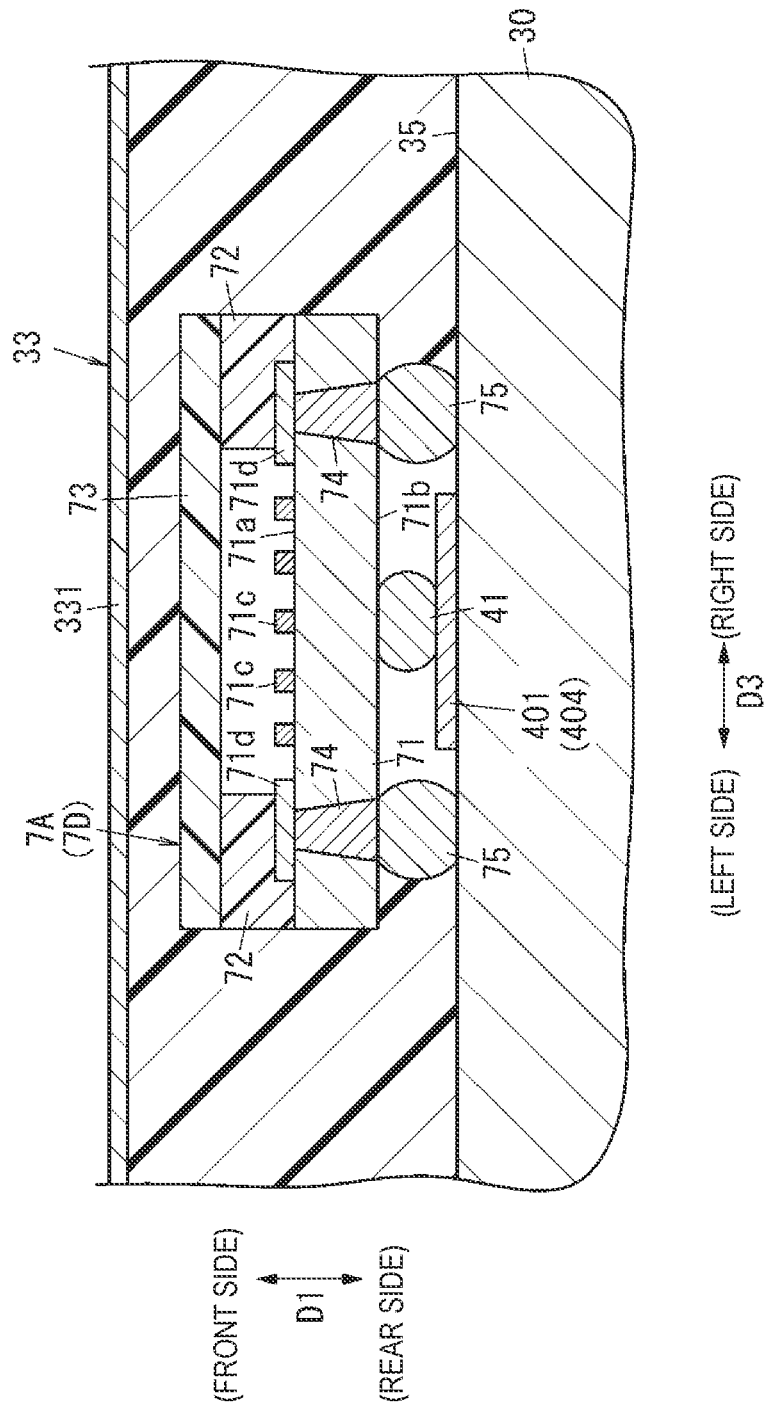
FIG. 5 is a sectional view taken along line Z2-Z2 in FIG. 4, illustrating principal components seen in the sectional view.

Referring to FIGS. 4 and 5, a radio-frequency module 1 according to an embodiment includes a mounting substrate 30 (substrate), a transmitting filter 7A, a transmitting filter 7D, a resin layer 32A, a shield layer 33, a conductor 401, and a conductor 404. The mounting substrate 30 has a first main surface 35 and a second main surface 36 on opposite sides.

The transmitting filter 7A is mounted on the first main surface 35 of the mounting substrate 30. The passband of the transmitting filter 7A is a first frequency band. The transmitting filter 7D is mounted on the first main surface 35 of the mounting substrate 30. The passband of the transmitting filter 7D is a second frequency band. The resin layer 32A is disposed on the first main surface 35 of the mounting substrate 30. The transmitting filters 7A and 7D are at least partially covered with the resin layer 32A. The shield layer 33 is disposed on an outer surface of the resin layer 32A. The conductor 401 is disposed on the first main surface 35 of the mounting substrate 30 and is in contact with the transmitting filter 7A and the mounting substrate 30. The conductor 404 is disposed on the first main surface 35 of the mounting substrate 30 and is in contact with the transmitting filter 7B and the mounting substrate 30. The radio-frequency module 1 is capable of performing simultaneous transmission by using both the transmitting filter 7A and the transmitting filter 7D. The conductor 401 extends off an edge of the transmitting filter 7A (a first filter) and to a side other than a side closer to the transmitting filter 7D (a second filter) and is in contact with the shield layer 33. The conductor 404 extends off an edge of the transmitting filter 7A (the first filter) and to a side other than a side closer to the transmitting filter 7A (the second filter) and is in contact with the shield layer 33. The conductors 401 and 404 disposed as above reduce the possibility that heat generated by the transmitting filters 7A and 7D will cause deterioration of the characteristics of the transmitting filters 7A and 7D while both the transmitting filters 7A and 7D are used for simultaneous transmission.

(2) Details

The radio-frequency module 1 and a communication device 100 according to an embodiment will be described in detail with reference to FIGS. 1 to 6.

(2-1) Configuration of Communication Device

Figure 1:
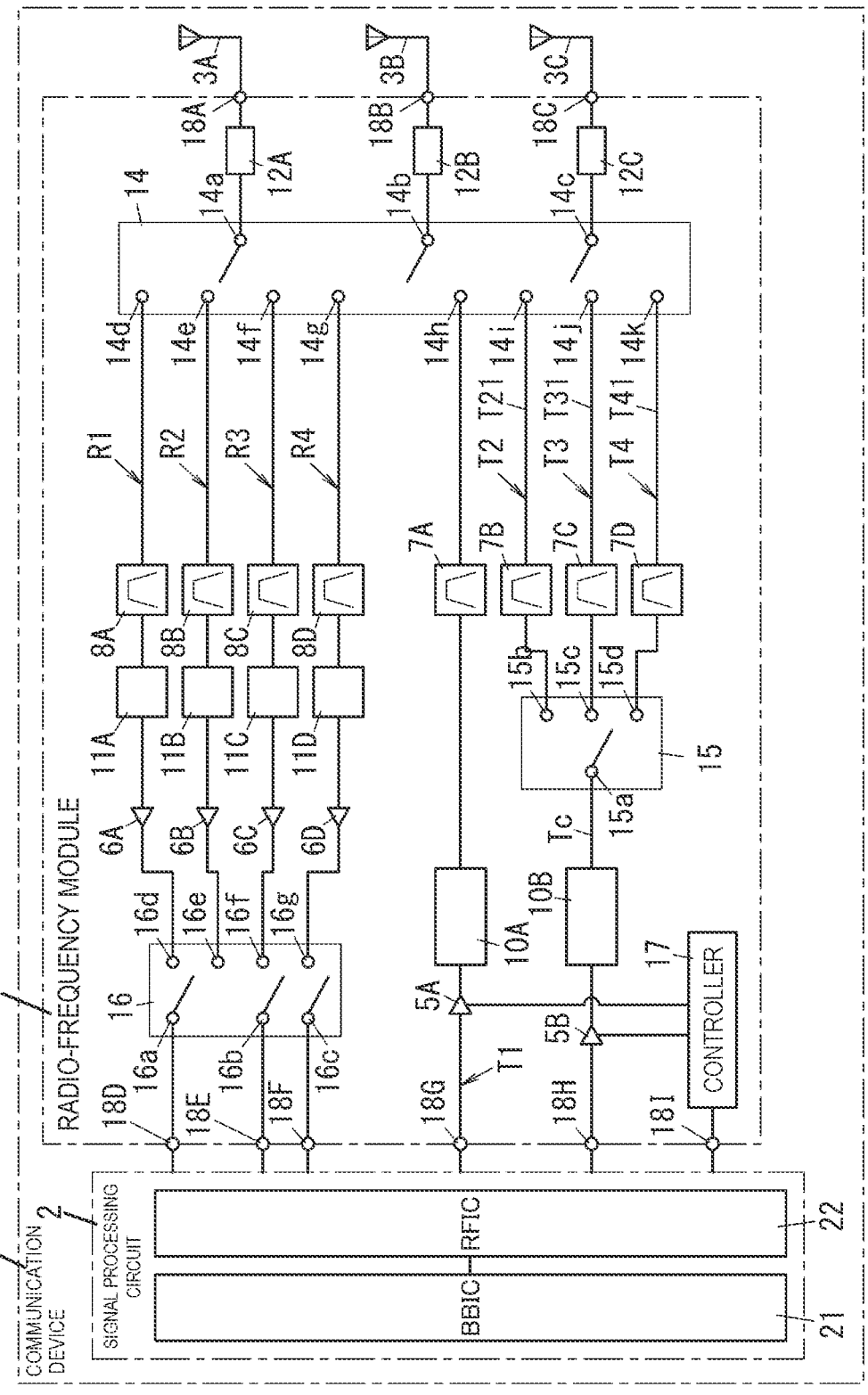
FIG. 1 is a block diagram of a radio-frequency module and a communication device according to an embodiment.

Referring to FIG. 1, the communication device 100 includes the radio-frequency module 1. The communication device 100 is, for example, a mobile terminal, such as a smartphone. In some embodiments, the communication device 100 is a wearable terminal, such as a smart watch. The radio-frequency module 1 supports, for example, the fourth-generation mobile communication (4G) standard or the fifth-generation mobile communication (5G) standard. The 4G standard is, for example, the 3GPP Long Term Evolution (LTE) standard. The 5G standard is, for example, 5G New Radio (NR). The radio-frequency module 1 supports, for example, carrier aggregation and dual connectivity.

The communication device 100 includes, in addition to the radio-frequency module 1, a signal processing circuit 2, and a plurality of antennas. For example, three antennas denoted respectively by 3A to 3C are included as illustrated in FIG. 1.

The radio-frequency module 1 is configured to amplify transmission signals (radio-frequency signals) input from the signal processing circuit 2 and to output resultant signals to the antennas 3A to 3C. The radio-frequency module 1 is also configured to amplify reception signals input through the antennas 3A to 3C and to output resultant signals to the signal processing circuit 2. The radio-frequency module 1 may be controlled by the signal processing circuit 2.

The signal processing circuit 2 is connected to the radio-frequency module 1 and is configured to process transmission signals for transmission to the radio-frequency module 1 and to process reception signals received from the radio-frequency module 1. The transmission signals are to be transmitted through the antennas 3A to 3C, and the reception signals are received through the antennas 3A to 3C. The signal processing circuit 2 includes a baseband signal processing circuit 21 and a radio-frequency (RF) signal processing circuit 22.

The baseband signal processing circuit 21 is, for example, a baseband integrated circuit (BBIC). The baseband signal processing circuit 21 generates transmission signals from baseband signals (e.g., audio signals and image signals) input from the outside and outputs resultant transmission signals to the RF signal processing circuit 22. The baseband signal processing circuit 21 receives reception signals from the RF signal processing circuit 22 and outputs the reception signals to the outside. The signals (reception signals) output by the baseband signal processing circuit 21 are used, for example, as image signals for displaying an image or as audio signals for a telephone conversation.

The RF signal processing circuit 22 is, for example, a radio-frequency integrated circuit (RFIC) and processes radio-frequency signals (transmission signals and reception signals). The RF signal processing circuit 22 performs signal processing such as up-conversion on transmission signals output by the baseband signal processing circuit 21 and outputs resultant signals to the radio-frequency module 1. The RF signal processing circuit 22 also performs signal processing such as down-conversion on reception signals received from the radio-frequency module 1 and outputs resultant signals to the baseband signal processing circuit 21.

(2-2) Circuit Configuration of Radio-Frequency Module

As illustrated in FIG. 1, the radio-frequency module 1 transmits radio-frequency signals (reception signals and transmission signals) between the signal processing circuit 2 and each of the antennas 3A to 3C.

The radio-frequency module 1 includes a plurality of power amplifiers, a plurality of low-noise amplifiers, a plurality of transmitting filters, and a plurality of receiving filters. For example, two power amplifiers respectively denoted by 5A and 5B, four low-noise amplifiers respectively denoted by 6A to 6D, four transmitting filters respectively denoted by 7A to 7D, and four receiving filters respectively denoted by 8A to 8D are included, as illustrated in FIG. 1. The radio-frequency module 1 also includes a plurality of output matching circuits and a plurality of matching circuits. For example, two output matching circuits respectively denoted by 10A and 10B, four matching circuits respectively denoted by 11A to 11D, and three matching circuits respectively denoted by 12A to 12C are included, as illustrated in FIG. 1. The radio-frequency module 1 also includes a first switch 14, a second switch 15, a third switch 16, a controller 17, and a plurality of external connection terminals. For example, eight external connection terminals respectively denoted by 18A to 18J are included, as illustrated in FIG. 1. The radio-frequency module 1 also includes a plurality of signal paths for transmission of signals and a plurality of signal paths for reception of signals. For example, two signal paths respectively denoted by T1 to T4 are included for transmission of signals, and four signal paths respectively denoted by R1 to R4 are included for reception of signals, as illustrated in FIG. 1.

Antenna terminals respectively denoted by 18A to 18C, signal output terminals respectively denoted by 18D to 18F, and signal input terminals respectively denoted by 18G to 18I, and more than one ground terminal denoted by 18J (see FIG. 3) are included as the external connection terminals 18A to 18J. The antennas 3A to 3C are connected to the antenna terminals 18A to 18C, respectively. Reception signals processed by the radio-frequency module 1 are output to the RF signal processing circuit 22 through the signal output terminals 18D to 18F. The signal output terminals 18D to 18F are connected to input parts of the signal processing circuit 2 with electric conduction paths therebetween. For example, each of the signal output terminals 18D to 18F is connected to the corresponding one of three input parts of the signal processing circuit 2 illustrated in FIG. 1. Transmission signals output by the RF signal processing circuit 22 included in the signal processing circuit 2 are input to the signal input terminals 18G and 18H. The signal input terminals 18G and 18H are connected to output parts of the RF signal processing circuit 22 with electric conduction paths therebetween. For example, each of the signal input terminals 18G and 18H is connected to the corresponding one of two output parts of the RF signal processing circuit 22 illustrated in FIG. 1. Control signals output by the signal processing circuit 2 are input to the signal input terminal 18I. The signal input terminal 18I is connected to another output part of the RF signal processing circuit 22 with an electric conduction path therebetween. The external connection terminals 18J are ground terminals and are hereinafter referred to as ground terminals 18J. The ground terminals 18J are connected to ground electrodes of the communication device 100 and are placed at the ground potential accordingly.

The signal path T1 connects the signal input terminal 18G and a selection terminal 14h of the first switch 14 to each other. The power amplifier 5A, the output matching circuit 10A, and the transmitting filter 7A are disposed on the signal path T1 and are arranged in sequence from the side close to the signal input terminal 18G to the side close to the first switch 14. A signal (transmission signal) input to the signal input terminal 18G is processed by the power amplifier 5A, the output matching circuit 10A, and the transmitting filter 7A while flowing through the signal path T1. The resultant signal is then output to the first switch 14.

The signal paths T2 to T4 connect the signal input terminal 18H to selections terminals 14i to 14k of the first switch 14. The signal paths T2 to T4 each includes a common path and an individual path. The common path is denoted by Tc, and the individual paths are denoted by T21, T31, and T41, respectively. The common path Tc is shared by the signal paths T2 to T4. Each of the individual paths T21, T31, and T41 is part of the corresponding one of the signal paths T2 to T4. The common path Tc connects the signal input terminal 18H and a common terminal 15a of the second switch 15 to each other. The individual paths T21 to T41 connect selection terminals 15b to 15d of the second switch to the selection terminals 14i to 14k of the first switch 14. More specifically, each of the individual paths T21 to T41 connects the corresponding one of the selection terminals 15b to 15d and the corresponding one of the selection terminals 14i to 14k to each other. The power amplifier 5B and the output matching circuit 10B are disposed on the common path Tc and are arranged in sequence from the side close to the signal input terminal 18H to the side close to the first switch 14. Each of the transmitting filters 7B to 7D is disposed on the corresponding one of the individual paths T21 to T41.

The second switch 15 enables selective switching between three signal paths respectively denoted by T2 to T4. More specifically, the path to which the common path Tc is to be connected is selected out of the individual paths T21 to T41. In this way, the second switch 15 performs selective switching between the three signal paths respectively denoted by T2 to T4. The second switch 15 selects one out of the signal paths T2 to T4 such that the transmitting filter that is to be used for transmission of signals is selected from among the transmitting filters 7B to 7C. In the present embodiment, the second switch 15 selects one out of the signal paths T2 to T4. In some embodiments, however, the second switch 15 selects two or more signal paths.

A signal (transmission signal) input to the signal input terminal 18H is processed by the power amplifier 5B, the output matching circuit 10B, and the transmitting filter selected by the second switch 15 (i.e., one of the transmitting filters 7B to 7D) while flowing through the signal path selected by the second switch 15 (i.e., one of the signal paths T2 to T4). The resultant signal is then output to the first switch 14.

The signal paths R1 to R4 connect selection terminals 14d to 14g of the first switch 14 to selection terminals 16d to 16g of the third switch 16. The receiving filter 8A, the matching circuit 11A, and the low-noise amplifier 6A are disposed on the signal path R1 and are arranged in sequence from the side close to the first switch 14 to the side close to the third switch 16. The same goes for each of the signal paths R2 to R4 on which the respective receiving filters (the receiving filters 8B to 8D, the respective matching circuits (the matching circuits 11B to 11D), and the respective low-noise amplifiers (the low-noise amplifiers 6B to 6D) are disposed. A signal (reception signal) output through the selection terminal 14d of the first switch 14 is processed by the receiving filter 8A, the matching circuit 11A, and the low-noise amplifier 6A while flowing through the signal path R1. The resultant signal is then output to the third switch 16. The same goes for each of the signal paths R2 to R4 on which the respective receiving filters (the receiving filters 8B to 8D, the respective matching circuits (the matching circuits 11B to 11D), and the respective low-noise amplifiers (the low-noise amplifiers 6B to 6D) process signals output through the selection terminals 14e to 14g of the first switch 14.

The first switch 14 enables selective switching such that the signal paths T1 to T4 and the signal paths R1 to R4 are each connected to one of the three antennas respectively denoted by 3A to 3C. The first switch 14 is, for example, a switching integrated circuit (IC).

The first switch 14 includes a plurality of common terminals and a plurality of selection terminals. For example, three common terminals respectively denoted by 14a to 14c and eight selection terminals respectively denoted by 14d to 14k are included as illustrated in FIG. 1. Each of the three common terminals respectively denoted by 14a to 14c is connected to the corresponding one of the antenna terminals 18A to 18C with the corresponding one of the matching circuits 12A to 12C therebetween. That is, each of the three common terminals respectively denoted by 14a to 14c is connected the corresponding one of the antennas 3A to 3C with the corresponding one of the matching circuits 12A to 12C and the corresponding one of the antenna terminals 18A to 18C therebetween. Four of the eight selection terminals respectively denoted by 14d to 14k, namely, the selection terminals 14d to 14g are connected to the four signal paths respectively denoted by R1 to R4. More specifically, each of the selection terminals 14d to 14g is connected to an input part of the corresponding one of the receiving filters 8A to 8D with the corresponding one of the signal paths R1 to R4 therebetween. The other four selection terminals respectively denoted by 14h to 14k are connected to the four signal paths respectively denoted by T1 to T4. More specifically, each of the selection terminals 14h to 14k is connected to an output part of the corresponding one of the transmitting filters 7A to 7D with the corresponding one of the signal paths T1 to T4 therebetween.

The first switch 14 makes a selection in accordance with a control signal output by the controller 17 to connect each common terminal to a desired selection terminal (signal path); that is, for each of the three common terminals respectively denoted by 14a to 14c (i.e., the three antennas respectively denoted by 3A to 3C), the first switch 14 makes a selection from the eight selection terminals respectively denoted by 14d to 14k (i.e., the eight signal paths respectively denoted by T1 to T4 and R1 to R4). For example, the first switch 14 is capable of establishing one-to-one connections and one-to-many connections.

The second switch 15 is a switch for selecting, out of the signal paths T2 to T4, a signal path through which transmission signals are to be transmitted. The second switch 15 is, for example, a switching IC. The second switch 15 includes the common terminal 15a and a plurality of selection terminals. For example, three selection terminals respectively denoted by 15b to 15d are included as illustrated in FIG. 1. The common terminal 15a is connected to the common path Tc. More specifically, the common terminal 15a is connected to an output part of the output matching circuit 10B with the common path Tc therebetween. Each of the three selection terminals respectively denoted by 15b to 15d is connected to the corresponding one of the three signal paths respectively denoted by T2 to T4. More specifically, each of the selection terminals 15b to 15d is connected to an input part of the corresponding one of the transmitting filters 7B to 7D with the corresponding one of the signal paths T2 to T4 therebetween.

The second switch 15 makes a selection in accordance with a control signal output by the controller 17 to connect the common terminal 15a to a desired selection terminal; that is, the second switch 15 makes a selection from the three selection terminals respectively denoted by 15b to 15d. In this way, the second switch 15 selects, out of the signal paths T2 to T4, a signal path through which transmission signals are to be transmitted. In the present embodiment, the second switch 15 establishes a one-to-one connection. In some embodiments, however, the second switch 15 establishes a one-to-many connection.

The third switch 16 is a switch for selecting, out of the signal paths R1 to R4, a signal path through which reception signals are to be transmitted. The third switch 16 is, for example, a switching IC. The third switch 16 includes a plurality of common terminals and a plurality of selection terminals. For example, three common terminals respectively denoted by 16a to 16c and four selection terminals respectively denoted by 16d to 16g are included as illustrated in FIG. 1. Each of the three selection terminals respectively denoted by 16a to 16c is connected to the corresponding one of the three signal output terminals respectively denoted by 18D to 18F. Each of the four selection terminals respectively denoted by 16d to 16g is connected to the corresponding one of the four signal paths respectively denoted by R1 to R4. More specifically, each of the selection terminals 16d to 16f is connected to an output part of the corresponding one of the low-noise amplifiers 6A to 6D with the corresponding one of the signal paths R1 to R4 therebetween.

The third switch 16 makes a selection in accordance with a control signal output by the controller 17 to connect each common terminal to a desired selection terminal (signal path); that is, for each of the three common terminals respectively denoted by 16a to 16c, the third switch 16 makes a selection from the four selection terminals respectively denoted by 16d to 16f (i.e., the four signal paths respectively denoted by R1 to R4). When being connected to one of the common terminals 16a to 16c, each of the signal paths R1 to R4 is selected as a signal path that is to be used. The third switch 16 may establish one-to-one connections or one-to-many connections.

The power amplifiers 5A and 5B are disposed on the signal paths T1 and T2, respectively. More specifically, the power amplifier 5B is disposed on the common path Tc that is part of the signal path T2. The power amplifiers 5A and 5B each has an input part and an output part. The input part of the power amplifier 5A and the input part of the power amplifier 5B are connected to the signal input terminals 18G and 18H, respectively. The output part of the power amplifier 5A and the output part of the power amplifier 5B are connected to an input part of the output matching circuit 10A and an input part of the output matching circuit 10B. The power amplifiers 5A and 5B amplify transmission signals input to the respective input parts and then output resultant signals from the respective output parts. The power amplifiers 5A and 5B are controlled by the controller 17.

The low-noise amplifiers 6A to 6D are disposed on the signal paths R1 to R4, respectively. The low-noise amplifiers 6A to 6D each has an input part and an output part. The input parts of the low-noise amplifiers 6A to 6D are connected to output parts of the matching circuits 11A to 11D, respectively. The output parts of the low-noise amplifiers 6A to 6D are connected to the selection terminals 16d to 16g of the third switch 16. The low-noise amplifiers 6A to 6D amplify reception signals input to the respective input parts and then output resultant signals from the respective output parts. The low-noise amplifiers 6A to 6D are controlled by controller 17.

The transmitting filters 7A and 7D are disposed on the signal paths T1 to T4, respectively. More specifically, the transmitting filters 7B to 7D are disposed on the individual path T21 being part of the signal path T2, the individual path T31 being part of the signal path T3, and the individual path T41 being part of the signal path T4, respectively. The transmitting filters 7A to 7D are filters whose passbands are different communication bands. For example, the passbands of the transmitting filters 7A to 7D are the transmission band of a first communication band (first frequency band), the transmission band of a second communication band, the transmission band of a third communication band, and the transmission band of a fourth communication band (second frequency band), respectively. The transmitting filter 7A to 7D each has an input part and an output part. The input part of the transmitting filter 7A is connected to an output part of the output matching circuit 10A. The output part of the transmitting filter 7A is connected to the selection terminal 14h of the first switch 14. The input parts of the transmitting filters 7B to 7D are connected to the selection terminals 15b to 15d of the second switch 15, respectively. The output parts of the transmitting filters 7B to 7D are connected to the selection terminals 14i to 14k of the first switch 14, respectively. A transmission signal input to the input part of each of the transmitting filters 7A to 7D is band-limited to the transmission band of the corresponding one of the first to fourth communication bands and is then output from the output part.

The transmitting filter 7A is connected to the power amplifier 5A with the output matching circuit 10A therebetween. Each of the transmitting filters 7B to 7D is connected to the power amplifier 5B with the second switch 15 and the output matching circuit 10B therebetween. That is, the transmitting filter 7A and each of the transmitting filters 7B to 7D are connected to different power amplifiers, which are denoted by 5A and 5B, respectively.

The receiving filters 8A to 8D are disposed on the signal paths R1 to R4, respectively. The receiving filters 8A to 8D are filters whose passbands are different communication bands. For example, the passbands of the receiving filters 8A to 8D are the reception band (communication band) of the first communication band, the reception band (communication band) of the second communication band, the reception band (communication band) of the third communication band, and the reception band (communication band) of the fourth communication band, respectively. The receiving filters 8A to 8D each has an input part and an output part. The input parts of the receiving filters 8A to 8D are connected to the selection terminals 14d to 14f of the first switch 14, respectively. The output parts of the receiving filters 8A to 8D are connected to input parts of the matching circuits 11A to 11D, respectively. A reception signal input to the input part of each of the receiving filters 8A to 8D is band-limited to the reception band of the corresponding one of the first to fourth communication bands and is then output from the output part.

Each of the receiving filters 8A to 8D is connected to the corresponding one of the low-noise amplifiers 6A to 6D with the corresponding one of the matching circuits 11A to 11D therebetween. That is, the receiving filters 8A to 8D are connected to different low-noise amplifiers, which are denoted by 6A to 6D, respectively.

The transmitting filters 7A to 7D and the receiving filters 8A to 8D are, for example, acoustic wave filters. For example, the acoustic wave filters are surface acoustic wave (SAW) filters that use surface acoustic waves. It is not required that the transmitting filters 7A to 7D and the receiving filters 8A to 8D be SAW filters. In some embodiments, the transmitting filters 7A to 7D and the receiving filters 8A to 8D are bulk acoustic wave (BAW) filters.

The output matching circuit 10A is disposed on the signal path T1. The output matching circuit 10B is disposed on the common path Tc. The output matching circuit 10A is a circuit that provides impedance matching between the power amplifier 5A and the transmitting filter 7A and includes, for example, an inductor. The output matching circuit 10A is connected between the output part of the power amplifier 5A and the input part of the transmitting filter 7A. The output matching circuit 10B is a circuit that provides impedance matching between the power amplifier 5B and each of the transmitting filters 7B to 7D and includes, for example, an inductor. The output matching circuit 10B is connected between the output part of the power amplifier 5A and the common terminal 15a of the second switch 15.

The matching circuits 11A to 11D are disposed on the signal paths R1 to R4, respectively. Each of the matching circuits 11A to 11D is a circuit that provides impedance matching between the corresponding one of the low-noise amplifiers 6A to 6D and the corresponding one of the receiving filters 8A to 8D and includes, for example, an inductor. Each of the matching circuits 11A to 11D is connected between the output part of the corresponding one of the receiving filters 8A to 8D and the input part of the corresponding one of the low-noise amplifiers 6A to 6D. Each of the matching circuits 12A to 12C is connected between the corresponding one of the common terminals 14a to 14c of the first switch 14 and the corresponding one of the antenna terminals 18A to 18C. Each of the matching circuits 12A to 12C is a circuit that provides impedance matching between the first switch 14 and the corresponding one of the antennas 3A to 3C and includes, for example, an inductor.

The controller 17 is a control device that controls circuit components (e.g., the power amplifiers 5A and 5B, the low-noise amplifiers 6A to 6D, the first switch 14, the second switch 15, and the third switch 16) in accordance with control signals output by the signal processing circuit 2. The controller 17 is electrically connected to the circuit components, such as the power amplifiers 5A and 5B and the low-noise amplifiers 6A to 6D. The controller 17 is connected the output part of the signal processing circuit 2 with the signal input terminal 18I therebetween. The controller 17 controls the circuit components in accordance with control signals output by the signal processing circuit 2 and input to the signal input terminal 18I.

(2-3) Workings of Communication Device

The workings of the communication device 100 will be described below with reference to FIG. 1.

The communication device 100 can transmit transmission signals in two communication bands (e.g., the first communication band and one of the second to fourth communication bands) simultaneously. To that end, the second switch 15 selects, out of the signal paths T2 to T4, a signal path through which transmission signals are to be transmitted. For example, the signal path T2 is selected. The first switch 14 selects, out of the three antennas respectively denoted by 3A to 3C, an antenna that is to be connected to the signal path T1 and an antenna that is to be connected to the signal path selected by the second switch 15. For example, the antenna 3B is selected for connection to the signal path T1, and the antenna 3C is selected for connection to the signal path T2.

In this state, transmission signals are output from the two of the output parts of the signal processing circuit 2 to two of the signal input terminals of the radio-frequency module 1 or, more specifically, to the signal input terminals 18G and 18H. A transmission signal input to the signal input terminal 18G is processed by the processing units (the power amplifier 5A, the output matching circuit 10A, and the transmitting filter 7A) while flowing through the signal path T1. The resultant signal flows through the first switch 14 and the matching circuit 12B and is then transmitted to the outside through the antenna 3B. A transmission signal input to the signal input terminal 18H is processed by the processing units (the power amplifier 5B, the output matching circuit 10B, and the transmitting filter 7B) while flowing through the signal path T2 selected by the second switch 15. The resultant signal flows through the first switch 14 and the matching circuit 12C and is then transmitted to the outside through the antenna 3C.

The communication device 100 transmits transmission signals in two communication bands (e.g., the first communication band and one of the second to fourth communication bands) simultaneously, in which case two transmitting filters corresponding to the two communication bands (e.g., the transmitting filter 7A and one of the transmitting filters 7B to 7D) work concurrently. That is, the two transmitting filters are used to enable simultaneous transmission.

Although simultaneous transmission of transmission signals in two transmission bands is herein described as an embodiment, the present disclosure is applicable to simultaneous transmission of transmission signals in three or more transmission bands. In some embodiments, three or more transmitting filters are used to enable simultaneous transmission of transmission signals in three or more corresponding transmission bands.

The communication device 100 can receive reception signals in two transmission bands (e.g., two of the first to fourth communication bands) simultaneously. To that end, the third switch 16 selects, out of the signal paths R1 to R4, two signal paths through which reception signals are to be transmitted. For example, the signal paths R1 and R2 are selected. For example, the common terminals 16*a* and 16*b* of the third switch 16 connect the selected two signal paths, namely, the signal paths R1 and R2 to the signal output terminals 18D and 18E, respectively. The first switch 14 selects, out of the three antennas respectively denoted by 3A to 3C, an antenna that is to be connected to the signal path selected by the third switch 16. For example, the antenna 3A is selected for connection to the signal paths R1 and R2.

A reception signal received through the antenna 3A flows through the matching circuit 12A and the first switch 14. The first switch 14 splits the signal into two. In a state in which the two signal paths respectively denoted by R1 and R2 are selected by the third switch 16, the resultant reception signals flow through the signal paths R1 and R2, respectively. The reception signal flowing through the signal path R1 is output to one of the input parts of the signal processing circuit 2 via the receiving filter 8A, the matching circuit 11A, the low-noise amplifier 6A, the third switch 16, and the signal output terminal 18D. The reception signal flowing through the signal path R2 is output to one of the input parts of the signal processing circuit 2 via the receiving filter 8B, the matching circuit 11B, the low-noise amplifier 6B, the third switch 16, and the signal output terminal 18E. The reception signals output to the input part of the signal processing circuit 2 are processed by the signal processing circuit 2 and are then output to the outside.

The communication device 100 receives reception signals in two communication bands (e.g., the first communication band and the second communication band) simultaneously, in which case two receiving filters corresponding to the two communication bands (e.g., the receiving filter 8A and the receiving filter 8B) work concurrently. That is, the two receiving filters are used to enable simultaneous transmission.

Although simultaneous reception of reception signals in two communication bands is herein described as an embodiment, the present disclosure is applicable to simultaneous reception of reception signals in three or more communication bands.

(2-4) Structure of Radio-Frequency Module

Figure 2:
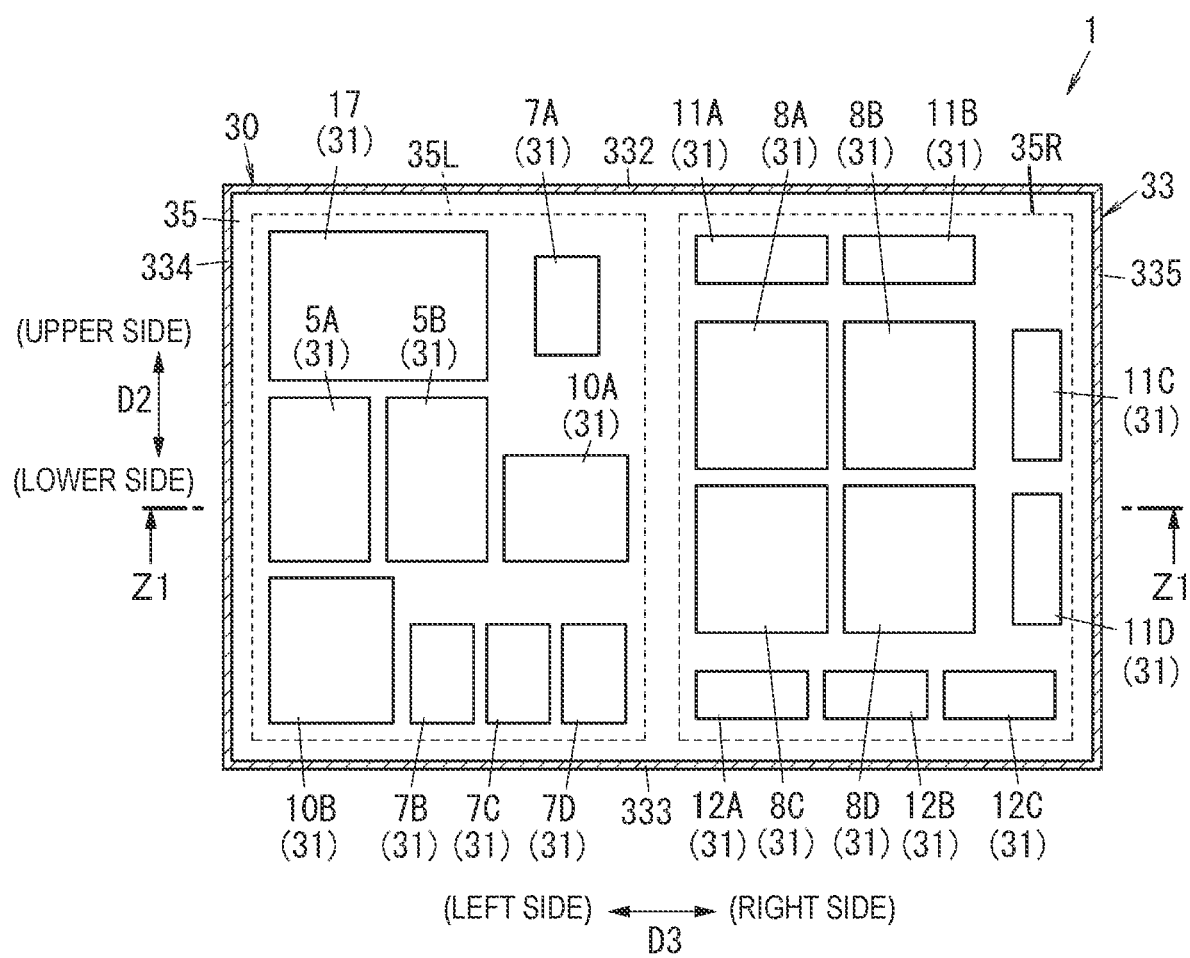
FIG. 2 is a plan view of the radio-frequency module.
Figure 3:
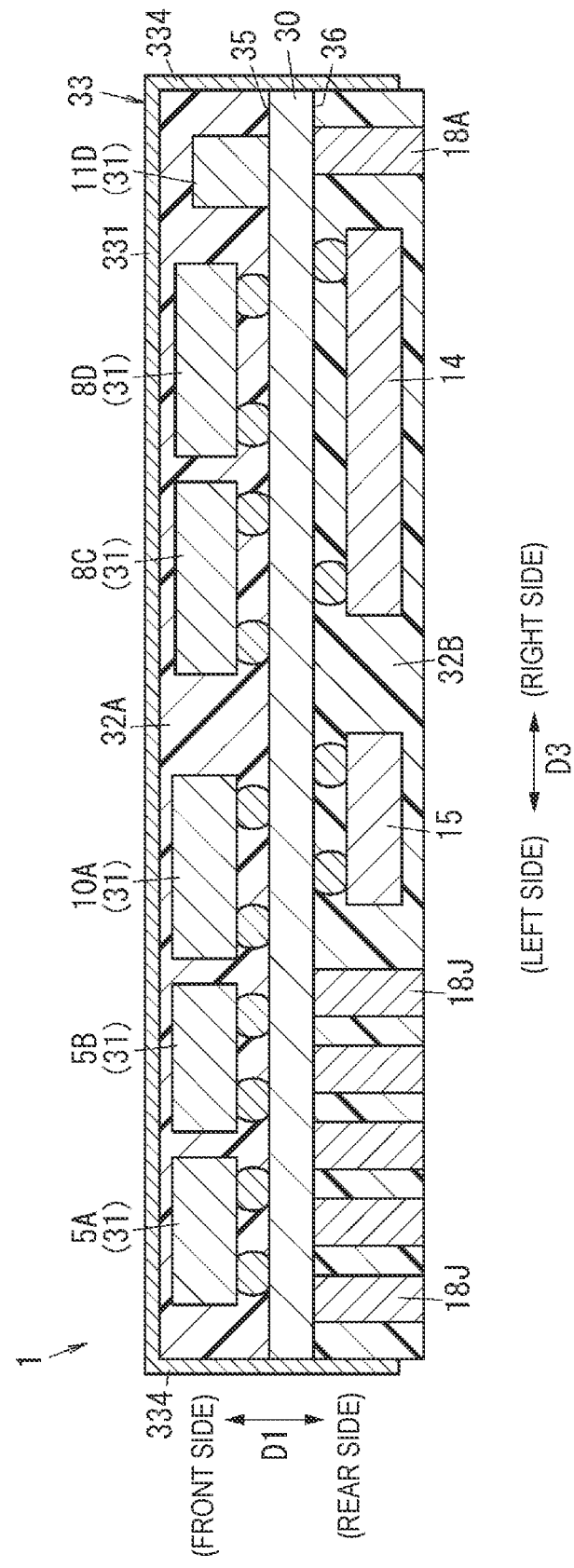
FIG. 3 is a sectional view taken along line Z1-Z1 in FIG. 2.

The following describes the structure of the radio-frequency module 1 with reference to FIGS. 2 and 3.

Referring to FIGS. 2 and 3, the radio-frequency module 1 includes the mounting substrate 30 (substrate), circuit components 31, the resin layer 32A, a resin layer 32B, and the shield layer 33.

The mounting substrate 30 is a substrate that is to be populated with circuit components as illustrated in FIG. 3. For example, the mounting substrate 30 is in the form of a rectangular plate. The mounting substrate 30 has the first main surface 35 and the second main surface 36, which are located on opposite sides in the thickness direction of the mounting substrate 30. The thickness direction is denoted by D1. The first main surface 35 and the second main surface 36 are, for example, rectangular (see FIG. 2).

The mounting substrate 30 is a multilayer substrate including, for example, a plurality of dielectric layers and a plurality of electrically conductive layers. The dielectric layers and the electrically conductive layers are stacked in the thickness direction D1 of the mounting substrate 30. The electrically conductive layers are formed into the respective predetermined patterns. One of the electrically conductive layers is a ground layer. The mounting substrate 30 of the radio-frequency module 1 includes via conductors, each of which forms an electrical connection between the ground layer and the corresponding one of the ground terminals 18J. The mounting substrate 30 is, for example, a low-temperature co-fired ceramic (LTCC) substrate. It is not required that the mounting substrate 30 be an LTCC substrate. The mounting substrate 30 may be a printed wiring board, a high-temperature co-fired ceramic (HTCC) substrate, or a resin multilayer substrate.

The thickness direction D1 of the mounting substrate 30 is hereinafter also referred to as a first direction D1. D2 denotes a second direction that is orthogonal to the first direction D1. For example, the second direction D2 is parallel to one of two pairs of opposite edges of the first main surface 35 of the mounting substrate 30. D3 denotes a third direction that is orthogonal to both the first direction D1 and the second direction D2. For example, the second direction D2 is parallel to the other pair of opposite edges of the first main surface 35 of the mounting substrate 30.

The upper and lower sides that are opposite sides in the second direction D2 on the drawing plane of FIG. 2 may be simply referred to as the rear side and the front side, respectively. Similarly, the left and right sides that are opposite sides in the third direction D3 on the drawing plane of FIG. 2 may be simply referred to as the left side and the right side, respectively. The upper and lower sides that are opposite sides in the first direction D1 on the drawing plane of FIG. 3 may be simply referred to as the upper side and the lower side, respectively.

Some of the circuit components 31 are mounted on the first main surface 35 of the mounting substrate 30, and the other circuit components 31 are mounted on the second main surface 36 of the mounting substrate 30. This implies, for example, that the circuit components 31 are each disposed on (i.e., mechanically connected to) the first main surface 35 or the second main surface 36 of the mounting substrate 30 or are electrically connected to (the relevant conductor portions of) the mounting substrate 30.

Examples of the circuit components 31 include the controller 17, the power amplifiers 5A and 5B, the transmitting filters 7A to 7D, the receiving filters 8A to 8D, the output matching circuits 10A and 10B, the matching circuits 11A to 11D, and the matching circuits 12A to 12C (see FIG. 2). The circuit components mentioned above are mounted on the first main surface 35 of the mounting substrate 30. The outside shape of each of the circuit components viewed in plan (i.e., in the thickness direction D1 of the mounting substrate 30) is, for example, rectangular.

The first main surface 35 of the mounting substrate 30 includes a first half region 35L and a second half region 35R. The first half region 35L of the first main surface 35 is located on one side or, more specifically, the left side (i.e., a first side) in the third direction D3. The second half region 35R of the first main surface 35 is located on the other side, namely, the right side (i.e., a second side) in the third direction D3.

Circuit components disposed on the first half region 35L of the mounting substrate 30 are mainly those relevant to signal transmission; that is, the power amplifiers 5A and 5B, the transmitting filters 7A to 7D, the output matching circuits 10A and 10B, and the controller 17 are disposed on the first half region 35L. The controller 17 and the transmitting filter 7A are disposed on one side of the first half region 35L or, more specifically, on one side (the upper side) in the second direction D2. The controller 17 and the transmitting filter 7A are located one side (the left side) and the other side (the right side), respectively, in the third direction D3. The power amplifiers 5A 5B and the output matching circuit 10A are located in the midsection of the first half region 35L in the second direction D2 and are arranged in sequence in the third direction D3. The power amplifier 5A and the output matching circuit 10A are located on one side (the left side) and the other side (the right side), respectively, in the third direction D3. The output matching circuit 10B, the transmitting filter 7B, the transmitting filter 7C, and the transmitting filter 7D are disposed on another side of the first half region 35L, namely, the other side (the lower side) in the second direction D2 and are arranged in sequence in the third direction D3. The output matching circuit 10B and the transmitting filter 7D are on one side (the left side) and the other side (the right side), respectively, in the third direction D3.

Components disposed on the second half region 35R of the mounting substrate 30 are mainly those relevant to signal reception; that is, the receiving filters 8A to 8D, the matching circuits 11A to 11D, and the matching circuits 12A to 12C are disposed on the second half region 35R. The receiving filters 8A to 8D are located in the midsection of the second half region 35R and are arranged in a matrix with two rows and two columns. The matching circuit 11A and the matching circuit 11B are disposed on one side of the second half region 35R or, more specifically, on the upper side in the second direction D2 and are arranged side by side in the third direction D3. The matching circuit 11C and the matching circuit 11D are disposed on another side of the second half region 35R or, more specifically, on the right side in the third direction D3 and are arranged side by side in the second direction D2. The matching circuits 12A to 12C are disposed on another side of the second half region 35R or, more specifically, on the lower side in the second direction D2 and are arranged side by side in the third direction D3.

As described above, the circuit components relevant to signal transmission are disposed on the first half region 35L, and the circuit components relevant to signal reception are disposed on the second half region 35R. The division of the mounting region eliminates or reduces the possibility of interference between the circuit components relevant to signal transmission and the circuit components relevant to signal reception, that is, interference between transmission signals and reception signals.

Examples of the circuit components 31 also include the first switch 14, the second switch 15, the third switch 16, and the low-noise amplifier 6A to 6D. The circuit components 31 mentioned above are mounted on the second main surface 36 of the mounting substrate 30.

As illustrated in FIG. 3, the resin layer 32A (hereinafter also referred to as "first resin layer 32A") is disposed on the first main surface 35 of the mounting substrate 30. The circuit components 31 disposed on the first main surface 35 of the mounting substrate 30 are covered with the first resin layer 32A. More specifically, the transmitting filters 7A to 7B, which are capable of working concurrently for simultaneous transmission of signals, are at least partially covered with the resin layer 32A. The circuit components 31 mentioned above are sealed with the first resin layer 32A. The first resin layer 32A is not illustrated in FIG. 2.

The resin layer 32B (hereinafter also referred to as "second resin layer 32B") is disposed on the second main surface 36 of the mounting substrate 30. The circuit components 31 mounted on the second main surface 36 of the mounting substrate 30 are covered with the second resin layer 32B and are sealed with the second resin layer 32B. More specifically, the external connection terminals 18A to 18J on the second main surface 36 are covered with the second resin layer 32B, with their tip faces being exposed at the surface of the second resin layer 32B. The circuit components 31 mounted on the second main surface 36 are entirely covered with the second resin layer 32B. The second resin layer 32B contains resin. The second resin layer 32B may be made of a mixture of resin and filler. The second resin layer 32B and the first resin layer 32A may be made of the same material or made be made of different materials.

The shield layer 33 is made of, for example, metal. The shield layer 33 is disposed on the outer surface (a peripheral surface and a top surface) of the first resin layer 32A, a peripheral surface of the second resin layer 32B, and a peripheral surface of the mounting substrate 30. The outer surface of the first resin layer 32A and the peripheral surface of the mounting substrate 30 are entirely covered with the shield layer 33. The peripheral surface of the second resin layer 32B is partially covered with the shield layer 33. More specifically, one part of the peripheral surface closer to the mounting substrate 30 than the other part in the first direction D1 is covered with the shield layer 33. The shield layer 33 is in contact with the ground layer of the mounting substrate 30. The shield layer 33 and the ground layer are placed at the same potential (at the ground potential of the radio-frequency module 1) accordingly.

(2-5) Heat Transfer Paths for Transmitting Filters

As described above with regard to the radio-frequency module 1 (see FIG. 2), the circuit components 31 relevant to signal transmission are disposed on the first half region 35L, and the circuit components 31 relevant to signal reception are disposed on the second half region 35R. In the present embodiment, any two or more of the transmitting filters 7A to 7D can work concurrently for simultaneous transmission of signals. For example, the transmitting filters 7A and 7D work concurrently for simultaneous transmission of signals. That is, the transmitting filters 7A and 7D are used to enable simultaneous transmission. The transmitting filters 7A and 7D that are capable of working concurrently for simultaneous transmission of signals are gathered together in the first half region 35L and are therefore close to each other. In the present embodiment, well thought-out heat transfer paths are provided to eliminate or reduce the possibility that the transmitting filters 7A and 7D that are close to each other and capable of working concurrently will affect each other due to heat generation. The well through-out heat transfer paths provided respectively for the transmitting filter 7A and 7D will be described in detail below with reference to FIGS. 4 and 5.

Referring to FIG. 4, the radio-frequency module 1 includes the conductors 401 and 404, which are disposed on the first main surface 35 of the mounting substrate 30 and are provided for the transmitting filters 7A and 7D, respectively. Each of the conductors 401 and 404 is a heat transfer path for the corresponding one of the transmitting filters 7A and 7D. Only some of the circuit components 31 disposed on the first main surface 35 or, more specifically, only the transmitting filters 7A and 7D and the conductors 401 and 404 are illustrated in FIG. 4.

As illustrated in FIG. 4, the transmitting filters 7A and 7D on the first main surface 35 of the mounting substrate 30 are located in the midsection in the third direction D3 and are close to the respective edges that are opposite in the second direction D2. The conductor 401 serving as a heat transfer path for the transmitting filter 7A and the conductor 404 serving as a heat transfer path for the transmitting filter 7D are disposed on the first main surface 35 of the mounting substrate 30. The wiring conductors of the mounting substrate 30 include wiring conductors other than the conductors 401 and 404. In some embodiments, however, the wiring conductors of the mounting substrate 30 serve as the conductors 401 and 404.

Each of the conductors 401 and 404 is in contact with the mounting substrate 30 and the corresponding one of the transmitting filters 7A and 7D (see FIG. 5). Each of the conductors 401 and 404 extends off an edge of the corresponding one of the transmitting filters 7A and 7D and to a side other than a side closer to the other transmitting filter (the transmitting filter 7D or 7A) and is in contact with the shield layer 33 (see FIG. 4). That is, each of the conductor 401 and 404 provided respectively for the transmitting filters 7A and 7D is in contact with the shield layer 33 on a side other than the side closer to the other transmitting filter (the transmitting filter 7D or 7A) than to the transmitting filter concerned. More specifically, the conductors 401 and 402 are provided for the transmitting filters 7A and 7D, respectively. The conductor 401 provided for the transmitting filter 7A is in contact with the shield layer 33 on a side other than the side closer to the transmitting filter 7D than to the transmitting filter 7A. The conductor 404 provided for the transmitting filter 7B is in contact with the shield layer 33 on a side other than the side closer to the transmitting filter 7A than to the transmitting filter 7B.

The shield layer 33 in an example illustrated in FIGS. 4 and 5 has surface portions with which the outer surface (the top surface and four side surfaces) of the resin layer 32A is covered. More specifically, the shield layer 33 has a top surface denoted by 331 and four side surfaces respectively denoted by 332 to 335. The five surfaces of the shield layer 33, that is, the top surface 331 and the four side surfaces respectively denoted by 332 to 335 may be collectively referred to as surface portions when there is no need to distinguish one from another; that is, the five surfaces may be hereinafter also referred to as surface portions 331 to 335, respectively.

More specifically, when viewed in plan in the thickness direction of the mounting substrate 30 (i.e., in the first direction D1) as illustrated in FIG. 4, each of the conductors 401 and 404 extends from the corresponding one of the transmitting filters 7A and 7D to the side opposite to the side on which the other transmitting filter (the transmitting filter 7D or 7A) is disposed. The conductors 401 and 404 are in contact with two of the four side surfaces of the shield layer 33 that are respectively denoted by 332 to 335. More specifically, the conductors 401 and 404 are in contact with the side surfaces located on the respective sides to which the conductors 401 and 404 extend. For example, the conductors 401 and 404 are in contact with the side surfaces 332 and 333, respectively. The conductor 401 provided for the transmitting filter 7A extends upward from the transmitting filter 7A and is in contact with the side surface 332 located on the upper side of the shield layer 33. The conductor 404 provided for the transmitting filter 7B extends downward from the transmitting filter 7B and is in contact with the side surface 333, which is located on the lower side of the shield layer 33.

That is, with the shield layer 33 having four side surfaces respectively denoted by 332 to 335, the conductors 401 and 404 illustrated in FIG. 4 extend to and are in contact with the side surfaces 332 and 333, which are closer than the other side surfaces of the shield layer 33 to the transmitting filters 7A to 7D. With the shield layer 33 having four side surfaces respectively denoted by 332 to 335, each of the transmitting filters 7A and 7D in the present embodiment is closer to the corresponding one of the side surfaces 332 and 333 than to the other side surfaces of the shield layer 33. The side surfaces 332 and 333 are located on the rear side and the front side, respectively. With the shield layer 33 having four side surfaces respectively denoted by 332 to 335, the conductors 401 and 404 extend to and are in contact with the side surfaces 332 and 333, which are closer than the other side surfaces of the shield layer 33 to the transmitting filters 7A to 7D.

As mentioned above, the shield layer 33 has four side surfaces respectively denoted by 332 to 335, and two of the four side surfaces are closer than the other side surfaces of the shield layer 33 to the transmitting filters 7A and 7D. More specifically, a perpendicular line drawn from the center of the transmitting filter 7A to the corresponding one of the two side surface and a perpendicular line drawn from the center of the transmitting filter 7D to the corresponding one of the two side surfaces are shorter than perpendicular lines drawn from the center of the transmitting filter 7A or 7D to the other side surfaces when viewed in plan in the thickness direction of the mounting substrate 30 (i.e., in the first direction D1). As mentioned above, the conductors 401 and 404 extend to the side surfaces 332 and 333, which are closer than the other side surfaces of the shield layer 33 to the transmitting filters 7A to 7D. More specifically, the conductor 401 extends along the perpendicular line drawn from the center the transmitting filter 7A to the side surface 332 that is closer than the other side surfaces to the transmitting filter 7A, and the conductor 404 extends along the perpendicular line drawn from the center of the transmitting filter 7D to the side surface 333 that is closer than the other side surfaces to the transmitting filter 7D. When viewed in plan in the thickness direction of the mounting substrate 30 (i.e., in the first direction D1), the conductors 401 and 404 in contact with the respective closest side surfaces (i.e., the side surfaces 332 and 333) extend perpendicularly to the respective closest side surfaces (i.e., the side surfaces 332 and 333).

More specifically, when viewed in section in the thickness direction of the mounting substrate 30 (i.e., in the first direction D1) as illustrated in FIG. 5, the conductors 401 and 404 are in contact with the first main surface 35 of the mounting substrate 30 and extend along the first main surface 35. Each of the conductors 401 and 404 on the first main surface 35 of the mounting substrate 30 extending as above also lies in the region in which the corresponding one of the transmitting filters 7A and 7D is placed (i.e., in the region onto which the shape of the corresponding one of the transmitting filters 7A and 7D is projected). Each of the conductors 401 and 404 is in contact with a back surface of the corresponding one of the transmitting filters 7A and 7D with a connection member 41 therebetween. For example, the connection member 41 is a solder bump. More specifically, the transmitting filters 7A and 7D each includes a support substrate 71 and an IDT electrode 71c, which is supported by the support substrate 71. The support substrates 71 of the transmitting filters 7A and 7D mounted on the mounting substrate 30 are each located between the mounting substrate 30 and the IDT electrode 71c. Each of the conductors 401 and 404 is in contact with the support substrate 71 of the corresponding one of the transmitting filters 7A and 7D with the connection member 41 therebetween.

The configuration of the transmitting filters 7A and 7D and the mounting of the transmitting filters 7A and 7D on the mounting substrate 30 will be elaborated with reference to FIG. 5. FIG. 5 is a sectional view of the transmitting filter 7A. The transmitting filters 7A 7D have the same structure and are mounted identically. Thus, FIG. 5 may also be regarded as a sectional view of the transmitting filter 7D. The same holds for the transmitting filters 7B and 7C; that is, the transmitting filters 7A to 7D have the same structure and are mounted identically. The transmitting filters 7A and 7D in the present embodiment each includes, in addition to the support substrate 71, a spacer layer 72, a cover member 73, a plurality of through-via electrodes 74, and a plurality of connection terminals 75. For example, the connection terminals 75 are solder bumps.

One of two main surfaces of the support substrate 71 is denoted by 71a, and circuitry (a functional unit) including the IDT electrode (comb-shaped electrode) 71c and a plurality of pad electrodes 71d are disposed on the main surface 71a. That is, the support substrate 71 supports the IDT electrode 71c. The pad electrodes 71d is electrically connected to the circuitry to form an electrical connection between the circuitry and an external substrate (e.g., the mounting substrate 30). The spacer layer 72 is a member disposed between the support substrate 71 and the cover member 73 and defining a space in which the circuitry including the IDT electrode 71c is placed. For example, the spacer layer 72 is made of an electrical insulating material, such as an epoxy resin or polyimide, and is in the form of a rectangular frame. The spacer layer 72 on the main surface 71a of the support substrate 71 surrounds the circuitry including the IDT electrode 71c.

The cover member 73 is made of an electrical insulating material, such as an epoxy resin or polyimide, and is flat and plate-like in shape. The cover member 73 is disposed on the spacer layer 72, whose top is partially open and is covered with the cover member 73. Each of the through-via electrodes 74 is a conductive member forming an electrical connection between the corresponding one of the pad electrodes 71d on the main surface 71a of the support substrate 71 and the corresponding one of the connection terminals 75 on a main surface 71b of the support substrate 71 and extends across the support substrate 71 in the thickness direction. The connection terminals 75 are conductive members each forming an electrical connection between the support substrate 71 and a wiring conductor of the mounting substrate 30. For example, the connection terminals 75 are solder bumps. Each of the connection terminals 75 and the corresponding one of the through-via electrodes 74 are in contact with each other on the main surface 71b of the support substrate 71, and each of the connection terminals 75 and the wiring conductor of the mounting substrate 30 are in contact with each other on the first main surface 35 of the mounting substrate 30.

The transmitting filters 7A and 7D are mounted on the mounting substrate 30 with the support substrate 71 being closer than the IDT electrode 71c to the mounting substrate 30. Heat generated by the transmitting filters 7A and 7D arises from the support substrates 71 of the respective transmitting filters. More specifically, the IDT electrode 71c generates heat, and the support substrate 71 generates heat accordingly. This is the reason why the transmitting filters 7A and 7D are mounted on the mounting substrate 30 with the support substrate 71 facing the mounting substrate 30. This placement enables an effective heat transfer from each of the transmitting filters 7A and 7D to the corresponding one of the conductors 401 and 404 through the connection member 41.

The same holds for the transmitting filters 7B and 7C; that is, the transmitting filters 7A to 7D have the same structure and are mounted identically on the mounting substrate 30.

Figure 6:
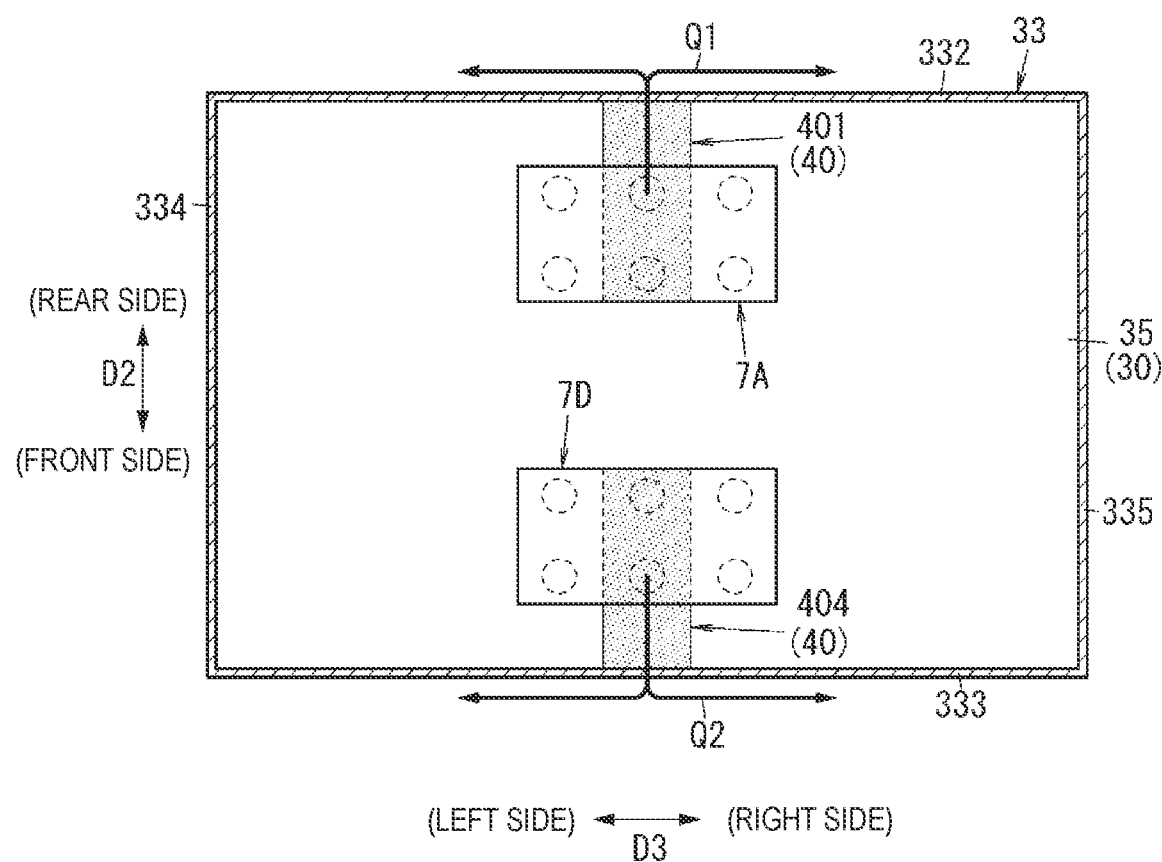
FIG. 6 is an explanatory drawing illustrating the transfer of heat generated by the transmitting filters.

FIG. 6 illustrates a case in which the transmitting filters 7A and 7D work concurrently for simultaneous transmission of signals and generate heat at the same time. Heat generated by the transmitting filter 7A and heat generated by the transmitting filter 7D are denoted by Q1 and Q2, respectively. The heat 01 generated by the transmitting filter 7A is transferred by the corresponding conductor (i.e., the conductor 401) and flows from the transmitting filter 7A to the side other than the side closer to the transmitting filter 7D than to the transmitting filter 7A. The heat Q1 is transferred to the shield layer 33 accordingly and is then dissipated from the shield layer 33. Likewise, the heat Q2 generated by the transmitting filter 7D is transferred by the corresponding conductor (i.e., the conductor 404) and flows from the transmitting filter 7D to the side other than the side closer to the transmitting filter 7A than to the transmitting filter 7D. The heat Q2 is transferred to the shield layer 33 accordingly and is then dissipated from the shield layer 33. Each of the conductors 401 and 404 serves as a heat transfer path for the corresponding one of the transmitting filters 7A and 7D. Thus, the heat transfer paths for the transmitting filters 7A and 7D, that is, the conductors 401 and 404 are less susceptible to the heat Q2 generated by the transmitting filter 7D and the heat Q1 generated by the transmitting filter 7A, respectively. This yields an improvement in the heat dissipation properties of each of the transmitting filters 7A and 7D and thus eliminates or reduces the possibility that heat generated at the same time by the transmitting filters 7A and 7D working concurrently for simultaneous transmission of signals will cause deterioration of the characteristics of the transmitting filters 7A and 7D.

The resultant improvement in the heat dissipation properties of the transmitting filters 7A and 7D eliminates or reduces the possibility that the heat Q1 generated by the transmitting filter 7A and the heat Q2 generated by the transmitting filter 7D will affect the transmitting filter 7D and the transmitting filter 7A, respectively. Thus, the resultant improvement in the heat dissipation properties of one of the two transmitting filters leads to an improvement in the heat dissipation properties of the other transmitting filter. This synergy eliminates or reduces the possibility that heat generated at the same time by the transmitting filters 7A and 7D working concurrently for simultaneous transmission of signals will cause deterioration of the characteristics of the transmitting filters 7A and 7D. That is, deterioration of the characteristics of each of the transmitting filters 7A and 7D is inhibited.

Two of the transmitting filters 7A to 7D or, more specifically, the transmitting filters 7A and 7D have been described above as examples of the transmitting filters that can work concurrently for simultaneous transmission of signals. The radio-frequency module 1 in the present embodiment also includes conductors (not illustrated) provided for the transmitting filters 7B and 7C as well as the conductors 401 and 404 provided for the transmitting filters 7A and 7D. In the present embodiment, the transmitting filters 7A and 7B can work concurrently for simultaneous transmission of signals. The relationship between the conductor provided for the transmitting filter 7A and the conductor provided for the transmitting filter 7D applies to the relationship between the conductor provided for the transmitting filter 7A and the conductor provided for the transmitting filter 7B. The transmitting filters 7A and 7C can also work concurrently for simultaneous transmission of signals. The relationship between the conductor provided for the transmitting filter 7A and the conductor provided for the transmitting filter 7D also applies to the relationship between the conductor provided for the transmitting filter 7A and the conductor provided for the transmitting filter 7C. This yields an improvement in the heat dissipation properties of any two or more transmitting filters capable of working concurrently for simultaneous transmission of signals and thus eliminates or reduces the possibility that the characteristics of each of the transmitting filters 7A to 7D will deteriorate.

(3) Principal Effects

The radio-frequency module 1 according to the embodiment described above includes the mounting substrate 30 (substrate), the transmitting filters (e.g., the transmitting filters 7A and 7D, a resin layer 32A, the shield layer 33, the conductors (e.g., the conductors 401 and 404). The mounting substrate 30 has the first main surface 35 and the second main surface 36 on opposite sides. The transmitting filter 7A is mounted on the first main surface 35 of the mounting substrate 30 and is a filter whose passband is the first frequency band. The transmitting filter 7D is mounted on the first main surface 35 of the mounting substrate 30 and is a filter whose passband is the second frequency band. The resin layer 32A is disposed on the first main surface 35 of the mounting substrate 30. The transmitting filters 7A and 7D are at least partially covered with the resin layer 32A. The shield layer 33 is disposed on the outer surface of the resin layer 32A. The conductor 401 is disposed on the first main surface 35 of the mounting substrate 30 and is in contact with the transmitting filter 7A and the mounting substrate 30. The conductor 404 is disposed on the first main surface 35 of the mounting substrate 30 and is in contact with the transmitting filter 7D and the mounting substrate 30. The transmitting filters 7A and 7D are used to enable simultaneous transmission. The conductor 401 is in contact with the shield layer 33 on a side other than the side closer to the transmitting filter 7D (the second filter) than to the transmitting filter 7A (the first filter). The conductor 404 is in contact with the shield layer 33 on a side other than the side closer to the transmitting filter 7D (the first filter) than to the transmitting filter 7A (the second filter). This feature reduces the possibility that heat generated by the transmitting filter 7A will cause deterioration of the characteristics of the transmitting filter 7D while both the transmitting filters 7A and 7D are used for simultaneous transmission. This feature also reduces the possibility that heat generated by the transmitting filter 7D will cause deterioration of the characteristics of the transmitting filter 7A.

(4) Modifications

The following describes modifications of the aforementioned embodiment.

(4-1) Modification 1

Figure 7:
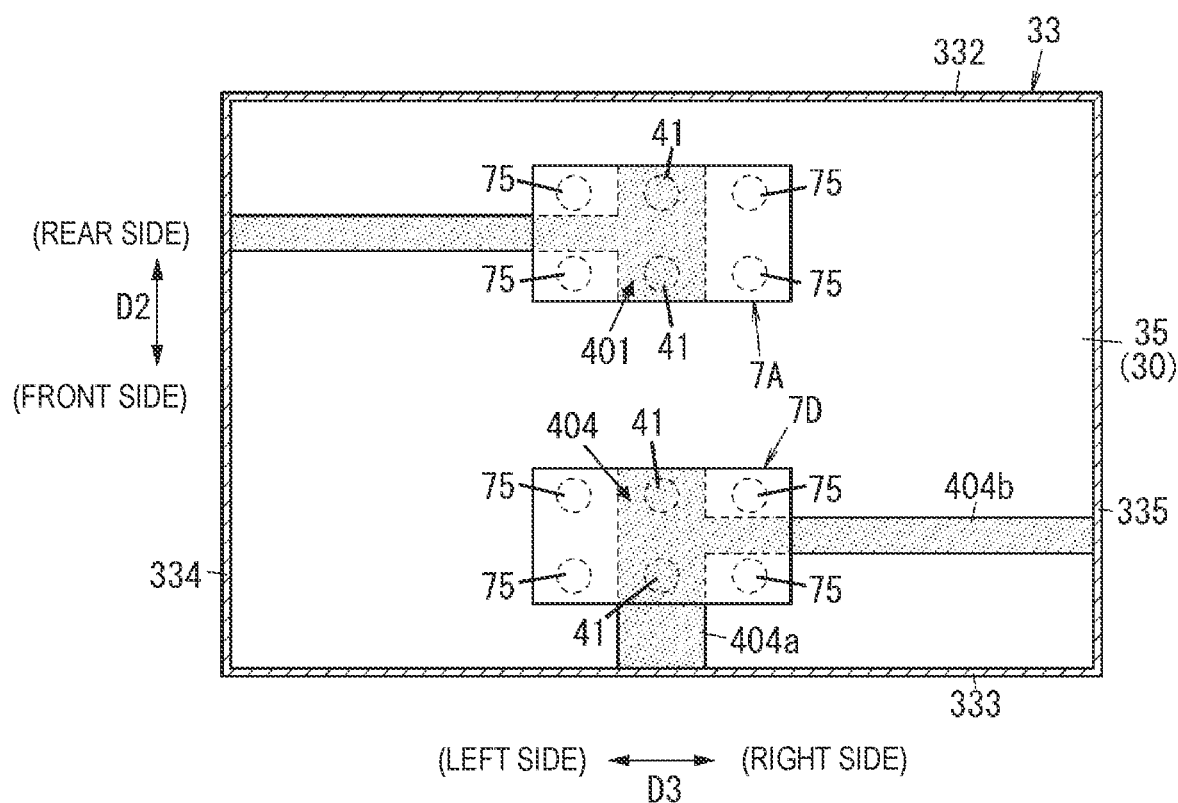
FIG. 7 is a plan view and illustrates the shapes of conductors in Modification 1.

This modification is an example that involves changing the direction in which the conductors 401 and 404 in the aforementioned embodiment extend. When viewed in plan in the thickness direction of the mounting substrate 30 (i.e., in the first direction D1) as illustrated in FIG. 7, the conductor 401 provided for the transmitting filter 7A in this modification extends from the transmitting filter 7A to one side in a direction (the third direction D3) orthogonal to the direction (the second direction D2) in which the transmitting filters 7A and 7D are aligned. With the shield layer 33 having side surfaces respectively denoted by 332 to 335, the conductor 401 is in contact with the side surface 334, which is located on the side to which the conductor 401 extends.

When viewed in plan in the thickness direction of the mounting substrate 30 (i.e., in the first direction D1), the conductor 404 provided for the transmitting filter 7D in this modification extends from the transmitting filter 7D to the other side in the direction (the third direction D3) orthogonal to the direction (the second direction D2) in which the transmitting filters 7A and 7D are aligned; that is, the conductors 401 and 404 extend to opposite sides in the direction concerned. The conductor 404 is in contact with one of the four side surfaces of the shield layer 33 that are respectively denoted by 332 to 335. More specifically, the conductor 404 is in contact with the side surface 335 located on the side to which the conductor 404 extends. Alternatively, the conductors 401 and 404 may extend to the same side in the direction concerned and both may be in contact with the side surface 334. As in the embodiment described above, the conductor 404 provided for the transmitting filter 7D in this modification also extends from the transmitting filter 7D to the side surface 333 on the front side of the shield layer 33 and is in contact with the side surface 333.

More specifically, the conductor 404 includes two constituent conductors, which are denoted by 404a and 404b, respectively. The two constituent conductors respectively denoted by 404a and 404b are connected to each other on the first main surface 35 of the mounting substrate 30 or, more specifically, in the region in which the transmitting filter 7D (the transmitting filter for which the conductor 404 is provided) is placed, that is, in the region onto which the shape of the transmitting filter 7D is projected. The constituent conductor 404a extends from the transmitting filter 7D (the transmitting filter for which the conductor 404 is provided) to the side surface 333 on the front side of the shield layer 33 and is in contact with the side surface 333 on the front side. When viewed in plan in the thickness direction of the mounting substrate 30 (i.e., in the first direction D1), the constituent conductor 404b extends from the transmitting filter 7D (the transmitting filter for which the conductor 404 is provided) to one side (e.g., the right side) in the direction orthogonal to the constituent conductor 404a and is in contact with the side surface 335 on the right side of the shield layer 33. Alternatively, the conductor 401 and the constituent conductor 404b may extend to the same side in the direction concerned and both may be in contact with the side surface 334. The two constituent conductors respectively denoted by 404a and 404b are in contact with the respective side surfaces. With the shield layer 33 having surface portions respectively denoted by 331 to 335, the constituent conductors 404a and 404b are in contact with the side surfaces 333 and 335, respectively.

With the shield layer 33 having surface portions respectively denoted by 331 to 335, the conductor 404 is in contact with two or more of the surface portions of the shield layer 33. For example, the conductor 404 is in contact with the side surfaces 333 and 335 as illustrated in FIG. 7. This feature yields a further improvement in the heat dissipation properties of the transmitting filter 7D.

With a further improvement in the heat dissipation properties of the transmitting filter 7D, this modification further reduces the possibility that heat generated by the transmitting filter 7D will cause deterioration of the characteristics of the transmitting filter 7A.

(4-2) Modification 2

This modification is an example that involves changing the arrangement of the conductors 401 and 404 in the aforementioned embodiment and the direction in which the conductors 401 and 404 extend. In this modification (see FIG. 8), the two transmitting filters (the transmitting filters 7A and 7D) capable of working concurrently for simultaneous transmission of signals are located in the midsection of the first main surface 35 of the mounting substrate 30 and are arranged side by side in the front-and-rear direction (i.e., in the second direction D2).

The conductor 401 provided for the transmitting filter 7A extends from the transmitting filter 7A to the side surface 332 located on the upper side of the shield layer 33 and is in contact with the side surface 332 on the upper side.

The conductor 404 provided for the transmitting filter 7D extends from the transmitting filter 7D to the three side surfaces of the shield layer 33 that are respectively denoted by 332 to 335 and is in contact with the side surfaces 332 to 335. More specifically, the conductor 404 includes three constituent conductors, which are denoted by 404a, 404b, and 404c, respectively. The three constituent conductors respectively denoted by 404a, 404b, and 404c are connected to each other on the first main surface 35 of the mounting substrate 30 or, more specifically, in the region in which the transmitting filter 7D (the transmitting filter for which the conductor 404 is provided) is placed, that is, in the region onto which the shape of the transmitting filter 7D is projected.

Figure 8:
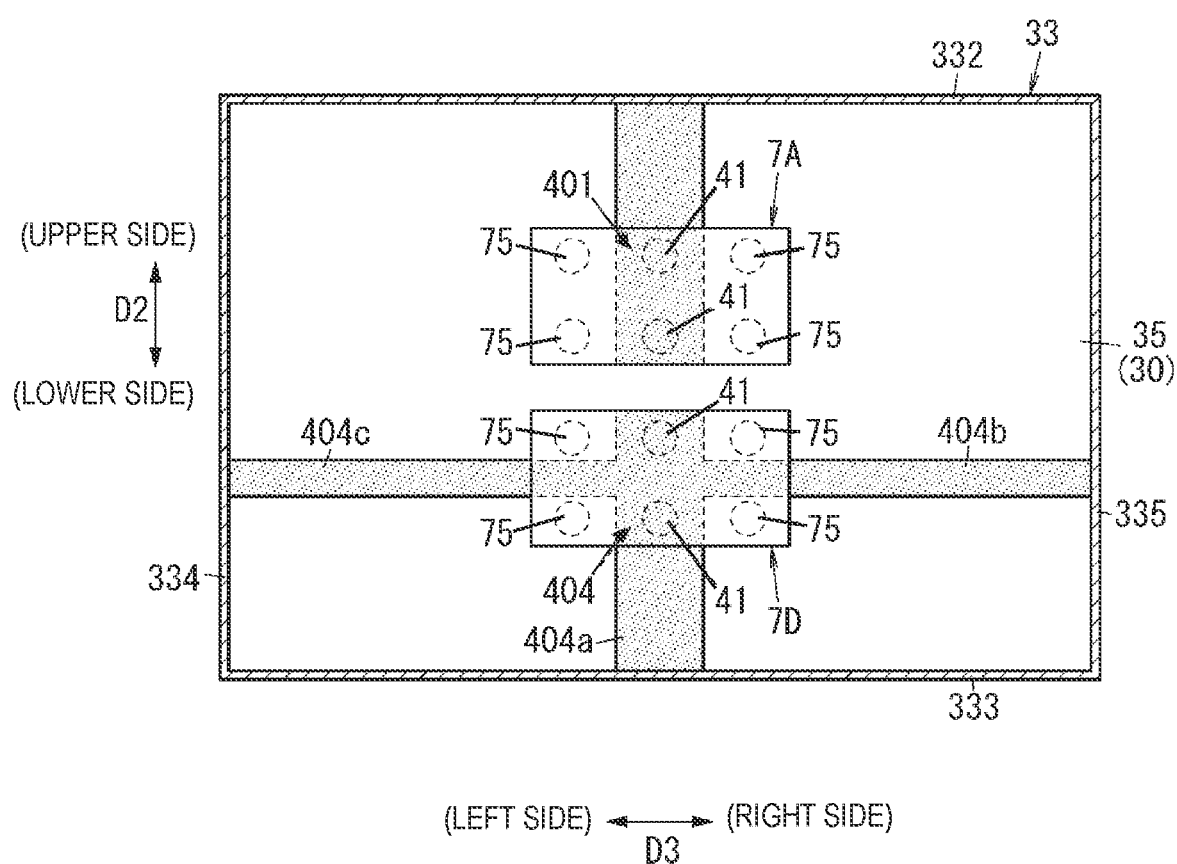
FIG. 8 is a plan view and illustrates the shapes of conductors in Modification 2.

The constituent conductor 404a extends from the transmitting filter 7D (the transmitting filter for which the conductor 404 is provided) to the side surface 333 on the front side of the shield layer 33 and is in contact with the side surface 333 on the front side. When viewed in plan in the thickness direction of the mounting substrate 30 (i.e., in the first direction D1), the constituent conductors 404b and 404c extend from the transmitting filter 7D (the transmitting filter for which the conductor 404 is provided) to the respective sides in the (left-and-right) direction (i.e., the third direction D3) orthogonal to the constituent conductor 404a and is in contact with the side surface 334 on the left side of the shield layer 33 and the side surface 335 on the right side of the shield layer 33, respectively. That is, the conductor 404 is in contact with two or more surface portions. For example, the conductor 404 is in contact with three side surfaces respectively denoted by 333, 334, and 335 as illustrated in FIG. 8. This feature yields a further improvement in the heat dissipation properties of the transmitting filter 7D. This modification further reduces the possibility that heat generated by the transmitting filter 7D will cause deterioration of the characteristics of the transmitting filter 7A.

(4-3) Modification 3

This modification is an example that involves changing the arrangement of the conductors 401 and 404 in the aforementioned embodiment and the direction in which the conductors 401 and 404 extend. In this modification (see FIG. 9), one of the two transmitting filters (the transmitting filters 7A and 7D) capable of working concurrently for simultaneous transmission of signals, namely, the transmitting filter 7D is located at a corner 35s of the first main surface 35 of the mounting substrate 30. To be more specific, the transmitting filter 7D is close to the corner 35s. The other transmitting filter, namely, the transmitting filter 7A is disposed on a desired part of the first main surface 35 of the mounting substrate 30. For example, the transmitting filter 7A is close to the middle of the first main surface 35.

As in Modification 2, the conductor 401 provided for the transmitting filter 7A extends from transmitting filter 7A to the side surface 332 located on the rear side of the shield layer 33 and is in contact with the side surface 332 on the rear side.

The conductor 404 provided for the transmitting filter 7D extends from the transmitting filter 7D to two side surfaces of the shield layer 33 respectively denoted by 333 and 335 and is in contact with the side surfaces 332 and 335. More specifically, the conductor 404 includes two constituent conductors and an extension. The two constituent conductors are denoted by 404a and 404b, respectively. The extension is denoted by 404d.

The two constituent conductors respectively denoted by 404a and 404b are connected to each other on the first main surface 35 of the mounting substrate 30 or, more specifically, in the region in which the transmitting filter 7D (the transmitting filter for which the conductor 404 is provided) is placed, that is, in the region onto which the shape of the transmitting filter 7D is projected. The constituent conductor 404a extends from the transmitting filter 7D (the transmitting filter for which the conductor 404 is provided) to the side surface 333 on the front side of the shield layer 33 and is in contact with the side surface 333 on the front side. When viewed in plan in the thickness direction of the mounting substrate 30 (i.e., in the first direction D1), the constituent conductor 404b extends from the transmitting filter 7D (the transmitting filter for which the conductor 404 is provided) to one side (e.g., the right side) in the direction orthogonal to the constituent conductor 404a and is in contact with the side surface 335 on the right side of the shield layer 33. With the shield layer 33 having four side surfaces respectively denoted by 332 to 335, the side surfaces 333 and 335 are two side surfaces that meet at the corner 35s.

The extension 404d is L-shaped at the corner 35s and is connected to tip portions of the two constituent conductors respectively denoted by 404a and 404b on the first main surface 35 of the mounting substrate 30. With the shield layer 33 having four side surfaces respectively denoted by 332 to 335, the extension 404d is in contact with the side surfaces 333 and 335, namely, the two side surfaces that meet at the corner 35s. When viewed in plan in the thickness direction of the mounting substrate 30 (i.e., in the first direction D1), the extension 404d (the conductor 404) extends along two side surfaces respectively denoted by 333 and 335.

Figure 9:
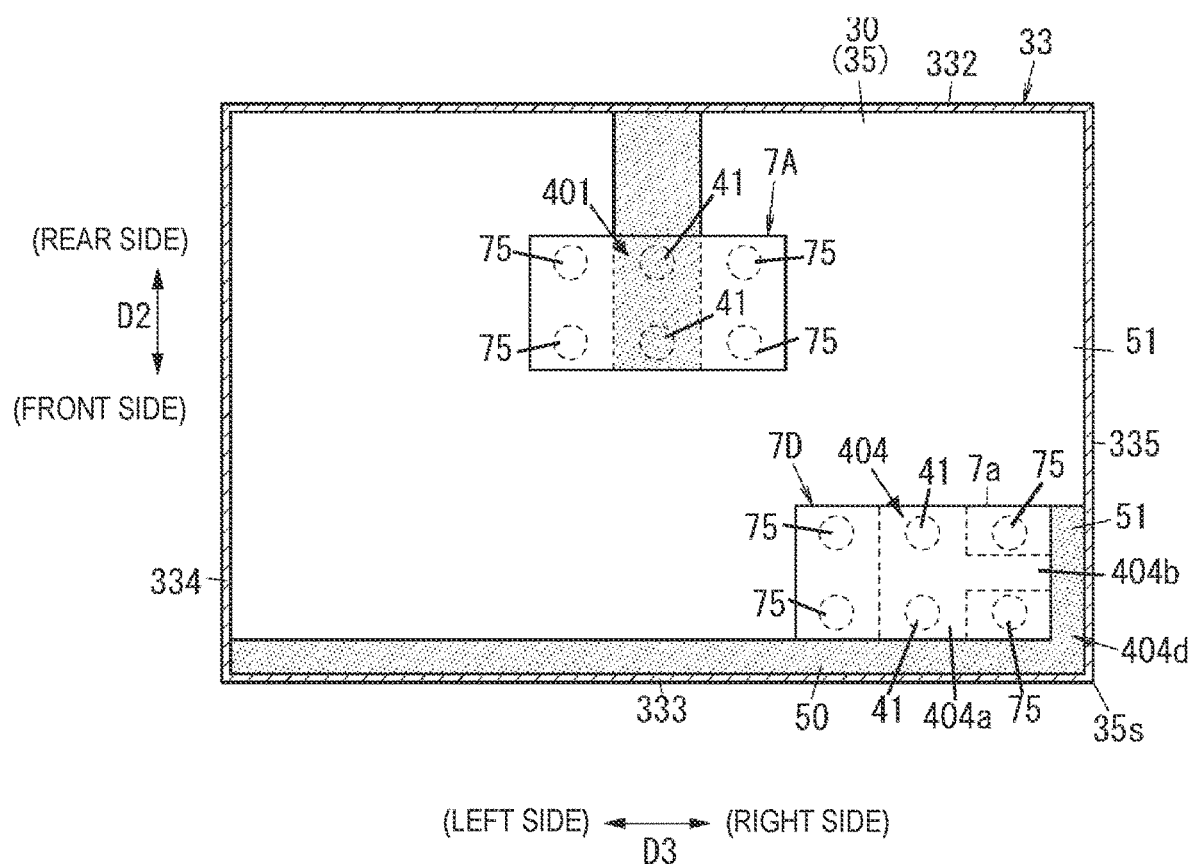
FIG. 9 is a plan view and illustrates the shapes of conductors in Modification 3.

More specifically, the extension 404d includes a first extension 50 and a second extension 51. The first extension 50 extends along the side surface 333 on the front side of the shield layer 33 and is in contact with the side surface 333; that is, the first extension 50 extends in the left-and-right direction of the mounting substrate 30 (i.e., in the third direction D3). Referring to FIG. 9, the first extension 50 extends across the mounting substrate 30 in the third direction D3; that is, the first extension 50 extends from the corner 35s to an end portion opposite to the corner 35s. The second extension 51 extends along the side surface 335 on the right side of the shield layer 33 and is in contact with the side surface 335; that is, the second extension 51 extends in the front-and-rear direction of the mounting substrate 30 (i.e., in the second direction D2). Referring to FIG. 9, the second extension 51 extends in the second direction D2 from the corner 35s to about an end portion 7a of the transmitting filter 7D. The end portion 7a of the mounting substrate 30 is one of two end portions of the mounting substrate 30 that are located on opposite sides in the second direction D2, and the end portion 7a is farther than the other end portion from the corner 35s.

The conductor 404 in this modification provides the following effect: with the shield layer 33 having side surfaces respectively denoted by 332 to 335, the transmitting filter 7D corresponding to the conductor 404 and disposed at the corner 35s of the first main surface 35 of the mounting substrate 30 is effectively in contact with two side surfaces that meet at a corner (e.g., the side surfaces 333 and 335 that meet at the corner 35s). This feature yields a further improvement in the heat dissipation properties of the transmitting filter 7D. This modification further reduces the possibility that heat generated by the transmitting filter 7D will cause deterioration of the characteristics of the transmitting filter 7A.

(4-4) Modification 4

This modification concerns an example in which three transmitting filters (e.g., the transmitting filters 7A to 7C) in the aforementioned embodiment can work concurrently for simultaneous transmission of signals. The conductors provided for the transmitting filters 7A to 7C are denoted by 401 to 403, respectively. In this modification (see FIG. 10), the three transmitting filters (the transmitting filters 7A, 7B, and 7C) on the first main surface 35 of the mounting substrate 30 are located in the midsection in the third direction D3 and are arranged side by side in the second direction D2.

The conductor 401 provided for the transmitting filter 7A is in contact with the shield layer 33 on a side other than the side closer to the transmitting filters 7B and 7C than to the transmitting filter 7A. The conductor 402 provided for the transmitting filter 7B is in contact with the shield layer 33 on a side other than the sides closer respectively to the transmitting filters 7A and 7C than to the transmitting filter 7B. The conductor 403 provided for the transmitting filter 7C is in contact with the shield layer 33 on a side other than the side closer to the transmitting filters 7A and 7B than to the transmitting filter 7C.

Figure 10:
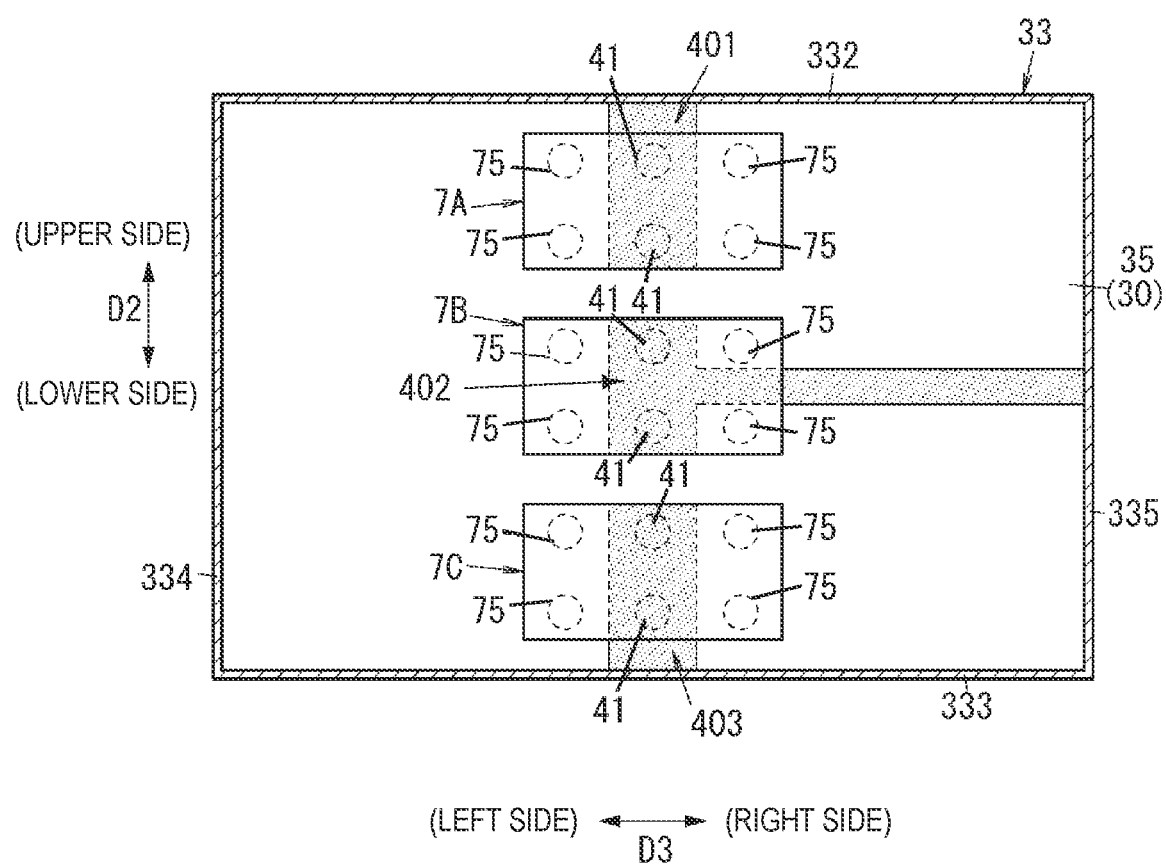
FIG. 10 is a plan view and illustrates the shapes of conductors in Modification 4.

Referring to FIG. 10, the conductor 401 provided for the transmitting filter 7A extends from the transmitting filter 7A to the side surface 332 located on the upper side of the shield layer 33 and is in contact with the side surface 332 on the upper side. The conductor 402 provided for the transmitting filter 7B extends from the transmitting filter 7B to the side surface 335 located on the right side of the shield layer 33 and is in contact with the side surface 335 on the right side. The conductor 403 provided for the transmitting filter 7C extends from the transmitting filter 7C to the side surface 333 located on the lower side of the shield layer 33 and is in contact with the side surface 333 on the lower side.

Effects similar to those of the aforementioned embodiment are produced accordingly; that is, this modification yields an improvement in the heat dissipation properties of each of the three transmitting filters respectively denoted by 7A to 7C and capable of working concurrently for simultaneous transmission of signals and thus eliminates or reduces the possibility that the characteristics of the transmitting filters 7A to 7C will deteriorate.

(4-5) Modification 5

Figure 11A:
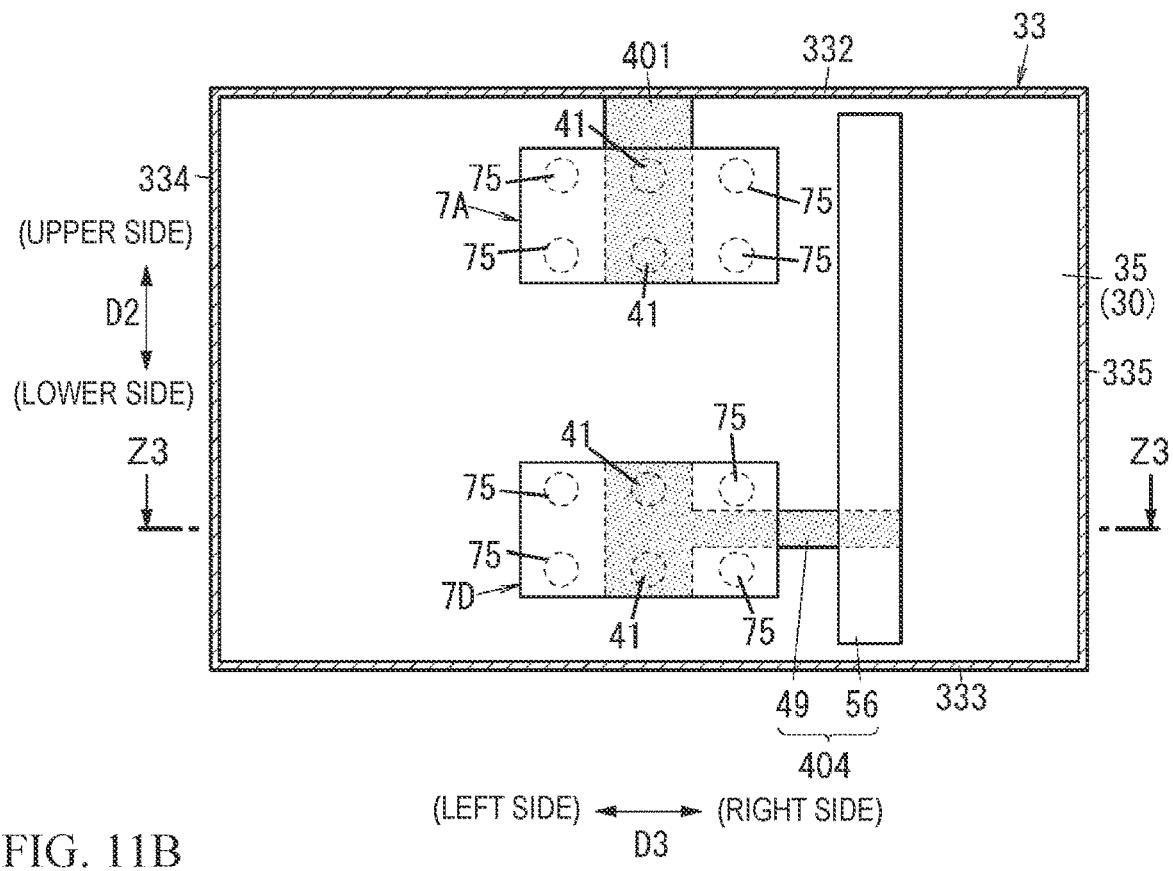
FIG. 11A is a plan view and illustrates the structures of conductors in Modification 5.
Figure 11B:
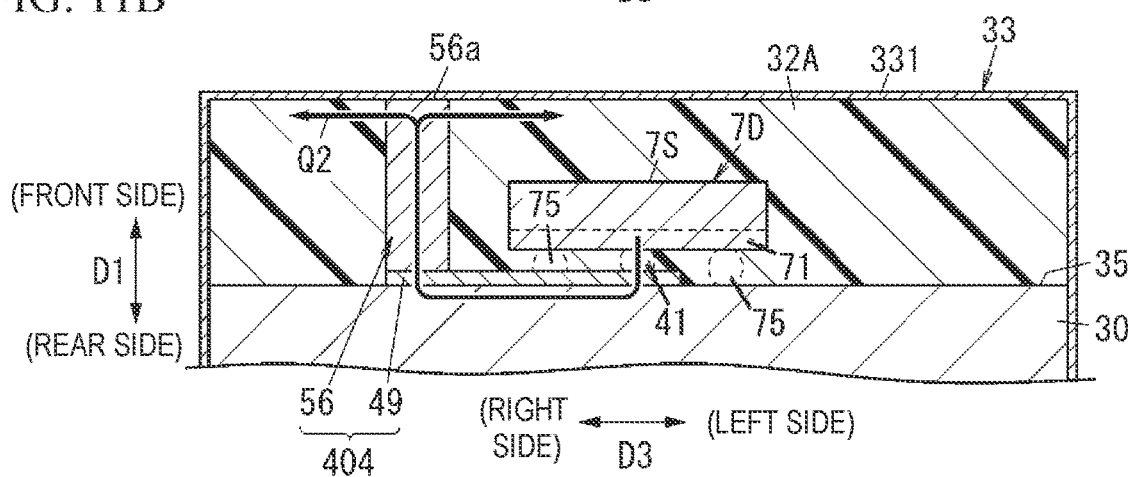
FIG. 11B is a sectional view taken along line Z3-Z3 in FIG. 11A and illustrates principal components seen in the sectional view.
Figure 12:
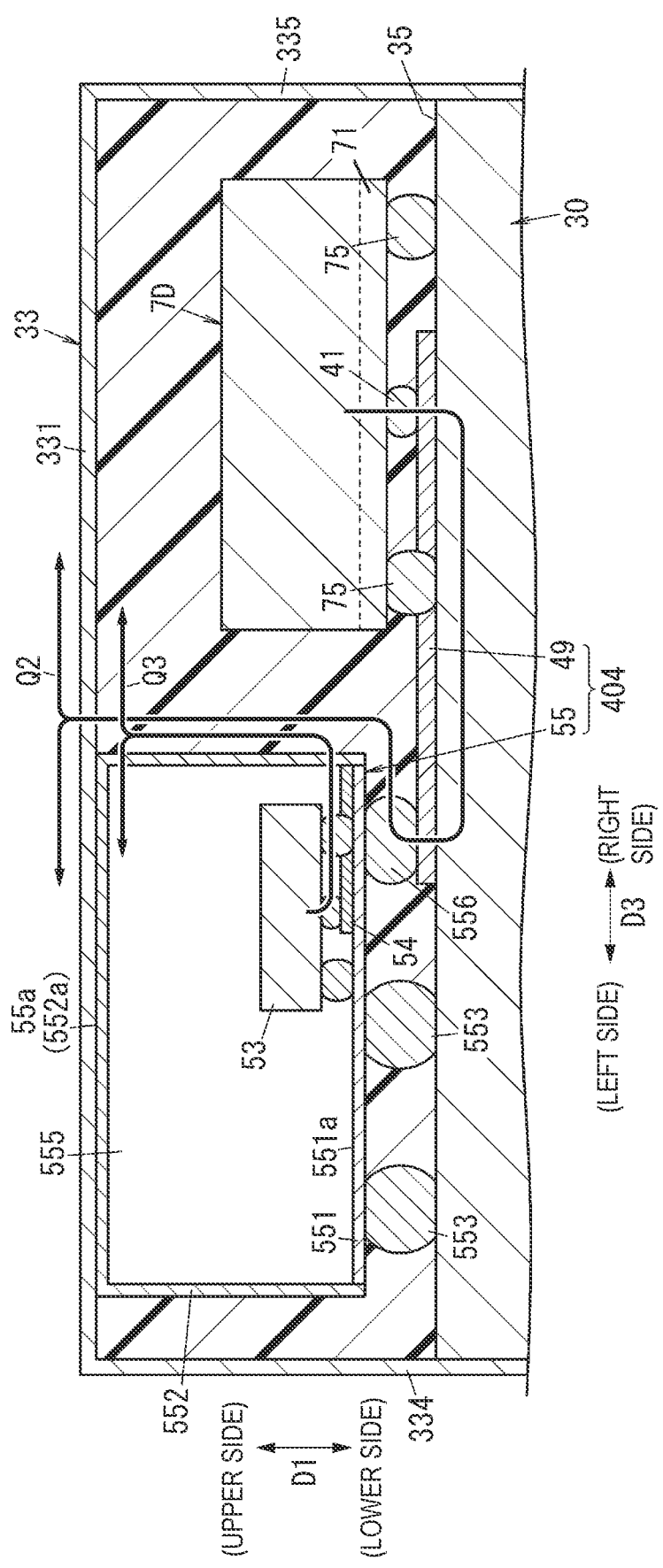
FIG. 12 is a sectional view and illustrates the structure of conductors in Modification 6.

This modification concerns an example in which the conductor 404 provided for the transmitting filter 7D in the aforementioned embodiment is in contact with the top surface 331 of the shield layer 33. Referring to FIG. 11A and FIG. 11B, the radio-frequency module 1 in this modification includes a partition member 56, which is electrically conductive. For example, the partition member 56 is a compartment shield. More specifically, the partition member 56 is disposed on a desired part of the first main surface 35 of the mounting substrate 30 to partition the inner part of the radio-frequency module 1 (i.e., the part surrounded with the mounting substrate 30 and the shield layer 33). The partition member 56 is made of an electrically conductive material (e.g., metal). The partition member 56 on the first main surface 35 of the mounting substrate 30 is in the form of a wall. The partition member 56 on the first main surface 35 of the mounting substrate 30 is on the right side of the transmitting filters 7A and 7D and extends in the second direction D2 (see FIG. 11A). The partition member 56 has a top surface 56a, which is in contact with the back side of the top surface 331 of the shield layer 33 (see FIG. 11B).

The conductor 404 in this modification includes a conductor main body 49 and the partition member 56. The conductor main body 49 is disposed on the first main surface 35 of the mounting substrate 30 and is in contact with the partition member 56 and the transmitting filter 7D for which the conductor 404 is provided. More specifically, the conductor main body 49 is, for example, strip-shaped with its contact region extending along the first main surface 35 of the mounting substrate 30. As described above, the conductors 401 and 404 in the aforementioned embodiment are in contact with the transmitting filter 7A and 7D, respectively. An end portion of the conductor main body 49 in this modification is in contact with the corresponding transmitting filter in the same fashion as the conductors 401 and 404 in the aforementioned embodiment; that is, the end portion of the conductor main body 49 lies in the region in which the transmitting filter 7D is placed, and the end portion is in contact with the support substrate 71 of the transmitting filter 7D with the connection member 41 (e.g., a solder bump) therebetween. The other end portion of the conductor main body 49 is in contact with the partition member 56. Referring to FIG. 10, the other end portion of the conductor main body 49 is located between the partition member 56 and the mounting substrate 30. That is, the already-existing partition member 56 is available for use as part of the conductor 404.

With the conductor 404 given as above, the heat Q2 generated by the transmitting filter 7D is transferred to the support substrate 71, the connection member 41, the conductor main body 49, and the partition member 56 in sequence. The heat is then transferred from the top surface 56a of the partition member 56 to the top surface 331 of the shield layer 33 and is dissipated from the shield layer 33.

This modification provides the following effects. Although a top surface 7S of the transmitting filter 7D is not in contact with the back side of the top surface 331 of the shield layer 33, the heat Q2 generated by the transmitting filter 7D is dissipated through the top surface 331 of the shield layer 33. With the addition of the conductor main body 49 to the already-existing partition member 56, that is, with such structural simplicity, the heat Q2 generated by the transmitting filter 7D is dissipated through the top surface 331 of the shield layer 33.

(4-6) Modification 6

The conductor 404 in Modification 5 makes use of the partition member 56 in the form of a wall, whereas the conductor 404 (a first conductor) in this modification makes use of a partition member 55, which has an internal accommodation part 555 defined therein. More specifically, the partition member 55 in this modification (see FIG. 12) is made of an electrically conductive material (e.g., copper) and is a box-shaped rectangular parallelepiped. The partition member 55 has a space (the internal accommodation part 555) in which a circuit board 53 populated with electronic components can be placed. That is, the partition member 55 in this modification divides the inner part of the radio-frequency module 1 (i.e., the part surrounded with the mounting substrate 30 and the shield layer 33) into an inner side and an outer side. The partition member 55 is mounted on the first main surface 35 of the mounting substrate 30. The partition member 55 has a top surface 55a, which is in contact with the back side of the top surface 331 of the shield layer 33.

More specifically, the partition member 55 includes a substrate 551, a shield wall 552, and connection members 553. For example, the shield wall 552 is made of an electrically conductive material (e.g., copper) and defines a box-shaped rectangular parallelepiped whose bottom is open. With the shield wall 552 being disposed on the substrate 551, the open bottom of the parallelepiped defined by the shield wall 552 is covered with the substrate 551. The space defined by the substrate 551 and the shield wall 552 is the internal accommodation part 555, in which the circuit board 53 is placed. The circuit board 53 is mounted on the substrate 551. The connection members 553 each forms an electrical connection between the substrate 551 and the mounting substrate 30. For example, the connection member 553 is a solder bump. At least one of the connection members 553 is a connection member for establishing a ground. The partition member 55 in the present embodiment defines an internal hollow space. Alternatively, a resin layer may be fitted in the space. The shield wall 552 has a top surface 552a, which is also regarded as the top surface 55a of the partition member 55 and is in contact with the back side of the top surface 331 of the shield layer 33.

In this modification, the conductor 404 provided for the transmitting filter 7D includes a conductor main body 49 and the partition member 55. The conductor main body 49 is similar to the conductor main body 49 in Modification 5. That is, the conductor main body 49 is, for example, strip-shaped with its contact region extending along the first main surface 35 of the mounting substrate 30. As in the aforementioned embodiment, an end portion of the conductor main body 49 is in contact with the transmitting filter 7D with the connection member 41 (e.g., a solder bump) therebetween. The other end portion of the conductor main body 49 on the first main surface 35 of the mounting substrate 30 lies in the region surrounded by the partition member 55 and is in contact with the back surface of the partition member 55 (i.e., the back surface of the substrate 551) with a connection member 556 (e.g., a solder bump) therebetween. The substrate 551 includes a wiring conductor, and the connection member 556 may be in contact with the shield wall 552 with the wiring conductor therebetween. This means that the conductor main body 49 may be in contact with the shield wall 552 with the connection member 556 and the wiring conductor of the substrate 551 therebetween. That is, as with the partition member in Modification 5, the already-existing partition member 55 in this modification is available for use as part of the conductor 404.

With the conductor 404 given as above, the heat Q2 generated by the transmitting filter 7D is transferred to the support substrate 71, the connection member 41, the conductor main body 49, and the partition member 55 in sequence, just as in the case of Modification 5. The heat is then transferred from the top surface 55a of the partition member 55 to the top surface 331 of the shield layer 33 and is dissipated from the top surface 331.

As with Modification 5, this modification provides the following effects. Although the top surface of the transmitting filter 7D is not in contact with the top surface 331 of the shield layer 33, the heat generated by the transmitting filter 7D is dissipated through the top surface 331 of the shield layer 33. With the addition of the conductor main body 49 to the already-existing partition member 55, that is, with such structural simplicity, the heat generated by the transmitting filter 7D is dissipated through the top surface 331 of the shield layer 33.

In this modification, a conductor 54 (a second conductor) may be disposed at the bottom of the internal accommodation part 555 of the partition member 55 (i.e., on a front surface 551a of the substrate 551). The conductor 54 is a member that forms an electrical connection between the circuit board 53 and the shield wall 552. The circuit board 53 is in contact with the shield wall 552 with the conductor 54 therebetween. Heat generated by the circuit board 53 is denoted by Q3. With the conductor 54 given as above, the heat Q3 is transferred through the conductor 54 and the shield wall 552 to the top surface 331 of the shield layer 33 and is dissipated from the top surface 331. That is, the partition member 55 serves as both a heat transfer path for the transmitting filter 7D and a heat transfer path for the circuit board 53. Thus, the heat generated by the circuit board 53 placed in the internal space defined by the partition member 55 is dissipated through the conductor 54, the partition member 55, and the shield layer 33.

(4-7) Modification 7

Figure 13A:
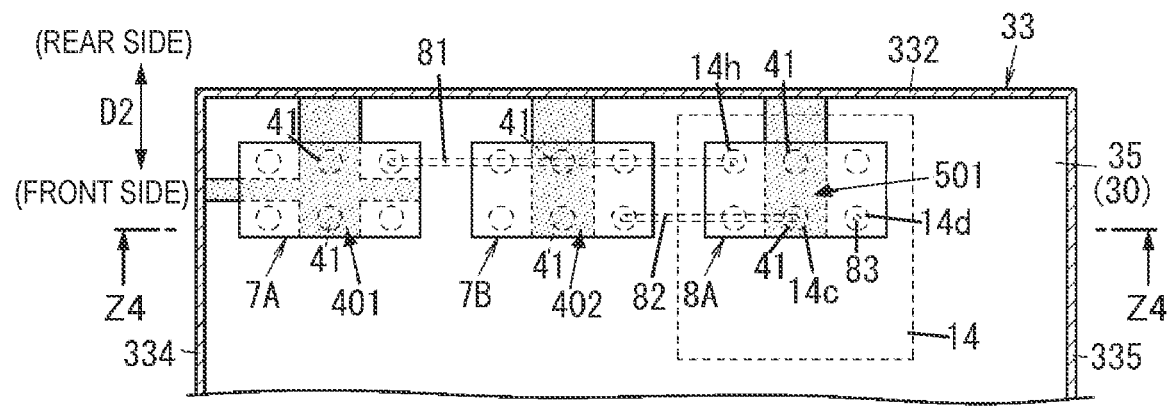
FIG. 13A is a plan view and illustrates the layout of conductors in Modification 7, signal lines, and transmitting filters.
Figure 13B:
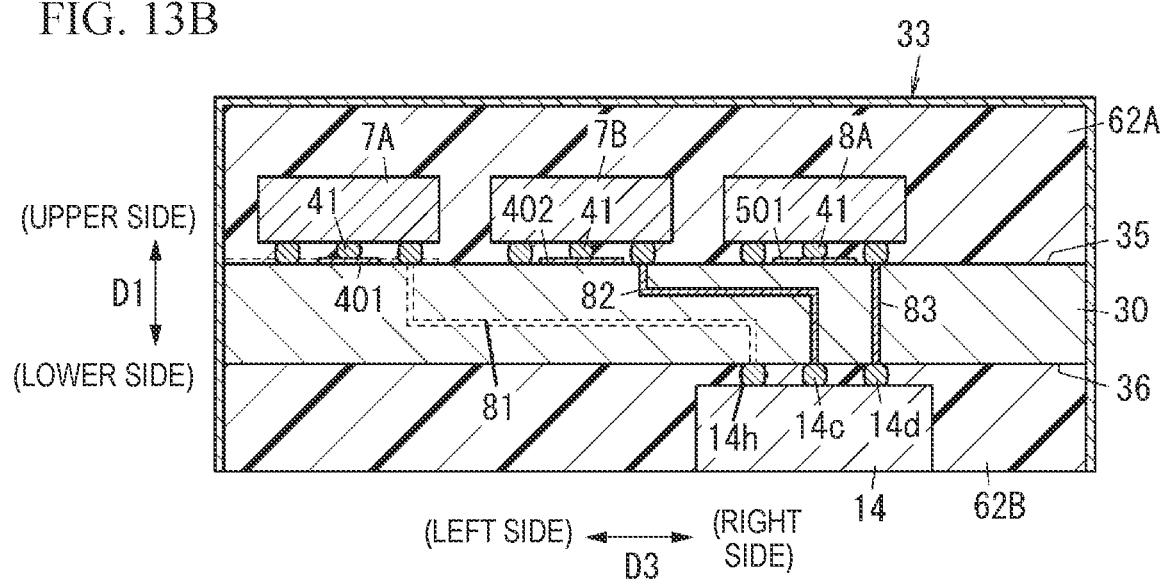
FIG. 13B is a sectional view taken along line Z4-Z4 in FIG. 13A.

This modification is illustrated in FIGS. 13A and 13B, in which signal lines disposed in the mounting substrate 30 overlap conductors serving as heat transfer paths for filters. For example, signal lines respectively denoted by 81 and 82 overlap conductors denoted respectively by 402 and 501. The conductors 402 and 501 each serves as a heat transfer path for the transmitting filter 7B and a heat transfer path for the receiving filter 8A. Not all of the transmitting filters 7A to 7D and the receiving filters 8A to 8D are illustrated in FIGS. 13A and 13B. More specifically, the transmitting filters 7A and 7B and the receiving filter 8A are illustrated in FIGS. 13A and 13B.

As illustrated FIG. 13B, the mounting substrate 30 in this modification is, for example, a multilayer substrate. The transmitting filters 7A and 7B, the receiving filter 8A, and the conductors 401, 402, and 501 are mounted on the first main surface 35 of the mounting substrate 30. The conductors 401, 402, and 501 are provided for the transmitting filter 7A, the transmitting filter 7B, and the receiving filter 8A, respectively.

The conductors 401, 402, and 501 are disposed on the first main surface 35 of the mounting substrate 30 (see FIG. 13A). One end portion of the conductor 401 lies in the region in which the transmitting filter 7A (the transmitting filter for which the conductor 401 is provided) is placed. The end portion of the conductor 401 is in contact with the transmitting filter 7A with the connection member 41 therebetween. The other end portion of the conductor 401 extends from the transmitting filter 7A to a side (the left side) other than the side closer to the transmitting filter 7B and the receiving filter 8A than to the transmitting filter 7A and is in contact with the side surface 334 of the shield layer 33. One end portion of the conductor 402 lies in the region in which the transmitting filter 7B (the transmitting filter for which the conductor 402 is provided) is placed. The end portion of the conductor 402 is in contact with the transmitting filter 7B with the connection member 41 therebetween. The other end portion of the conductor 402 extends from the transmitting filter 7B to a side (the rear side) other than the sides closer respectively to the transmitting filter 7A and the receiving filter 8A than to the transmitting filter 7B and is in contact with the side surface 332 of the shield layer 33. One end portion of the conductor 501 lies in the region in which the receiving filter 8A (the transmitting filter for which the conductor 501 is provided) is placed. The end portion of the conductor 501 is in contact with the receiving filter 8A with the connection member 41 therebetween. The other end portion of the conductor 501 extends from the receiving filter 8A to a side (the rear side) other than the side closer to the transmitting filters 7A and 7B than to the receiving filter 8A and is in contact with the side surface 332 of the shield layer 33.

The first switch 14 is disposed on the second main surface 36 of the mounting substrate 30. Signal lines respectively denoted by 81 to 83 are disposed in the mounting substrate 30. Transmission signals or reception signals may be transmitted through the signal lines 81 to 83. For example, the signal line 81 forms an electrical connection between the transmitting filter 7A and the selection terminal 14h of the first switch 14, and the signal line 82 forms an electrical connection between the transmitting filter 7B and the selection terminal 14i of the first switch 14. The signal line 83 forms an electrical connection between the receiving filter 8A and the selection terminal 14d of the first switch 14.

The signal line 81 extends from the transmitting filter 7A and passes through the inside of the mounting substrate 30. The signal line 81 extends below the conductor 402 and is connected to the selection terminal 14h of the first switch 14. The signal line 82 extends from the transmitting filter 7B and passes through the inside of the mounting substrate 30. The signal line 82 extends below the conductor 403 and is connected to the selection terminal 14i of the first switch 14. The signal line 83 extends from the receiving filter 8A and passes through the inside of the mounting substrate 30. The signal line 83 is connected to the selection terminal 14d of the first switch 14. It is not required that the signal lines 81 to 83 be disposed in the mounting substrate 30; that is, it is required that the signal lines 81 to 83 be disposed in the mounting substrate 30 and/or on the second main surface 36 of the mounting substrate 30.

When viewed in plan in the thickness direction of the mounting substrate 30 (i.e., in the first direction D1) as illustrated in FIG. 13A and FIG. 13B, the signal line 81 in this modification at least partially overlaps the conductor 402. The signal line 81 may at least partially overlap the conductor 501 when viewed in plan in the thickness direction of the mounting substrate 30 (i.e., in the first direction D1). Likewise, the signal line 82 may at least partially overlap the conductor 501.

The signal line 81 and the conductor 402 in this modification overlap each other when viewed in the thickness direction of the mounting substrate 30 (i.e., in the first direction D1). The conductor 402 eliminates or reduces the possibility that noise (an electromagnetic wave) produced in the signal line 81 will come into the transmitting filter 7B. The conductor 402 also eliminates or reduces the possibility that noise produced in the transmitting filter 7B will come into the signal line 81. The same holds true for the signal line 82 and the conductor 501, which overlap each other. The conductor 501 eliminates or reduces the possibility that noise produced in the signal line 82 will come into the receiving filter 8A. The conductor 501 also eliminates or reduces the possibility that noise produced in the receiving filter 8A will come into the signal line 82. Thus, the signal line 81 and the transmitting filter 7B are electromagnetically shielded from each other. Likewise, the signal line 82 and the receiving filter 8A are electromagnetically shielded from each other.

(4-8) Other Modifications

An embodiment has been described in which the transmitting filters 7A and 7D work concurrently for simultaneous transmission of signals. In some embodiments, however, any two or more of the receiving filters 8A to 8D work concurrently for simultaneous reception of signal, in which case conductors such as the conductors 401 and 404 in the aforementioned embodiment may serve as heat transfer paths for the two or more of the receiving filters 8A to 8D.

In the aforementioned embodiment, at least one of the transmitting filters 7A to 7D and at least one of the receiving filters 8A to 8D may work concurrently (for simultaneous transmission and reception of signals). The present disclosure is applicable to such an embodiment, in which case the at least one of the transmitting filters 7A to 7D and at least one of the receiving filters 8A to 8D are used in combination.

The mounting substrate 30 in the aforementioned embodiment is in the form of a rectangular plate. In some embodiments, the mounting substrate 30 is generally in the form of a polygonal plate or a circular plate. The shield layer 33 and the mounting substrate 30 has the same outside shape when viewed in plan. For example, both the outer shape of the mounting substrate 30 and the outer shape of the shield layer 33 are polygonal or circular when viewed in plan.

The aforementioned embodiment and Modifications 1 to 7 may be employed in combination.

In the aforementioned embodiment, two transmitting filters or more specifically, the transmitting filters 7A and 7D are capable of working concurrently for simultaneous transmission of signals and are connected to the power amplifiers 5A and 5B, respectively. In this case, the maximum power output of the power amplifier 5A may be greater than the maximum output of the power amplifier 5B. Only one of the two transmitting filters capable of working concurrently may be provided with a conductor. More specifically, the transmitting filter 7A connected to the power amplifier 5A whose maximum power output is greater than the maximum power output of the power amplifier 5B may be provided with the conductor 401; that is, the conductor 404 for the transmitting filter 7D connected to the power amplifier 5B may be eliminated. Settings may be made to ensure that the heat dissipation performance of the conductor 401 provided for the transmitting filter 7A connected to the power amplifier 5A whose maximum power output is greater than the maximum power output of the power amplifier 5B is higher than the heat dissipation performance of the conductor 404 provided for the transmitting filter 7D connected to the power amplifier 5B.

When the maximum power output of the power amplifier 5A is greater than the maximum power output of the power amplifier 5B, the amount of heat generated by the power amplifier 5A is greater than the amount of heat generated by the power amplifier 5B. When the power amplifier 5A is running hot, the heat generated by the power amplifier 5A can get into the power amplifier 5B. As a result, the characteristics of the power amplifier 5B can deteriorate. The same goes for the transmitting filters 7A and 7D that are connected to the power amplifiers 5A and 5B, respectively. That is, the amount of heat generated by the transmitting filter 7A connected to the power amplifier 5A whose maximum power output is greater than the maximum power output of the power amplifier 5B is greater than the amount of heat generated by the transmitting filter 7D connected to the power amplifier 5B. For this reason, the transmitting filter that can run hot, namely, the transmitting filter 7A is provided with the conductor 401. With an improvement in the heat dissipation properties of the transmitting filter 7A, this modification reduces the possibility that heat generated by the transmitting filter 7A will cause deterioration of the characteristics of the transmitting filter 7D.

As mentioned above, this modification is made with a focus on the maximum power output of each of the power amplifiers 5A and 5B. Alternatively, modifications may be made with a focus on power classes to which the power amplifiers 5A and 5B belong. The term power classes are categories of terminals and are based on their power output determined in accordance with, for example, the maximum power output. A power class with a smaller numeral denotes that the terminals in the power class concerned are capable of providing higher power. The maximum power output of devices in a high power class is greater than the maximum power output of devices in a non-high power class. For example, a method specified by 3GPP is used to measure the maximum power output. As for the aforementioned case, the power amplifier 5A belongs to the high power class, whereas the power amplifier 5B belongs to the non-high power class. Only the transmitting filter 7A connected to the power amplifier 5A in the smaller power class may be provided with the conductor 401; that is, the conductor 404 for the transmitting filter 7D connected to the power amplifier 5B in the smaller power class may be eliminated.

(5) Aspects of Disclosure

The following aspects of the present disclosure are disclosed herein.

In a first aspect of the present disclosure, a radio-frequency module (1) includes a mounting substrate (30), a first filter (e.g., 7A), a second filter (e.g., 7D), a resin layer (32A), a shield layer (33), and a conductor (e.g., 401). The mounting substrate (30) has a first main surface (35) and a second main surface (36) on opposite sides. The first filter (7A) is mounted on the first main surface (35) of the mounting substrate (30). The first filter (7A) is a filter whose passband is a first frequency band. The second filter (7D) is mounted on the first main surface (35) of the mounting substrate (30). The second filter (7D) is a filter whose passband is a second frequency band. The resin layer (32A) is disposed on the first main surface (35) of the mounting substrate (30). The first filter (7A) and the second filter (7D) are at least partially covered with the resin layer (32A). The shield layer (33) is disposed on an outer surface of the resin layer (32A). The radio-frequency module (1) is capable of performing simultaneous transmission or simultaneous reception by using both the first filter (7A) and the second filter (7D). The conductor (401) is disposed on the first main surface (35) of the mounting substrate (30) and is in contact with the first filter (7A) and the mounting substrate (30). The conductor (401) is in contact with the shield layer (33) on a side other than a side closer to the second filter (7D) than to the first filter (7A).

The conductor (e.g., 401) provided as above reduces the possibility that heat generated by the first filter (e.g., 7A) will cause deterioration of the characteristics of the second filter (e.g., 7D) while both the first filter (7A) and the second filter (7D) are used for simultaneous transmission. More specifically, the conductor (401) serving as a heat transfer path for the first filter (7A) is less susceptible to heat generated by the second filter (7D). The resultant improvement in the heat dissipation properties of the first filter (7A) eliminates or reduces the possibility that heat generated by the first filter (7A) will affect the second filter (7D). This reduces the possibility that the heat generated by the first filter (7A) will cause deterioration of the characteristics of the second filter (7D). The conductor (401) serving as a heat transfer path for the first filter (7A) eliminates or reduces the possibility that heat transferred through the heat transfer path for the first filter (7A) will affect the second filter (7D). The resultant improvement in the heat dissipation properties of the second filter (7D) eliminates or reduces the possibility that heat generated by the second filter (7D) will affect the first filter (7A). This reduces the possibility that the heat generated by the second filter (7D) will cause deterioration of the characteristics of the first filter (7A).

In a second aspect, the radio-frequency module (1) according to the first aspect further includes a first power amplifier (5A) and a second power amplifier (5B). The first power amplifier (5A) is connected to the first filter (7A). The second power amplifier (5B) is connected to the second filter (7D).

With the addition of the first power amplifier (5A) and the second power amplifier (5B) that are connected respectively to the first filter (7A) and the second filter (7D), the aforementioned effect will be produced; that is, the present disclosure eliminates or reduces the possibility that the characteristics of each of the first filter (7A) and the second filter (7D) will deteriorate.

In a third aspect, the radio-frequency module (1) according to the second aspect is as follows: the maximum power output of the first power amplifier (e.g., 7A) is greater than the maximum power output of the second power amplifier (e.g., 7D).

The conductor (404) enables an improvement in the heat dissipation properties of the first filter (7A) connected to the first power amplifier (5A), namely, the power amplifier whose maximum power output is greater than the other power amplifier.

In a fourth aspect, the radio-frequency module (1) in any one of the first to third aspects is as follows. The first filter (e.g., 7A) is an acoustic wave filter. The first filter (7A) includes an IDT electrode (71*c*) and a support substrate (71). The support substrate (71) supports the IDT electrode (71*c*). The first filter (e.g., 7A) is mounted on the mounting substrate (30) with the support substrate (71) being located between the mounting substrate (30) and the IDT electrode (71*c*).

When heat generated by the first filter (e.g., 7A) arises from the support substrate (71), this placement enables an effective heat transfer from the support substrate (71) to the conductor (401). This feature yields a further improvement in the heat dissipation properties of the first filter (e.g., 7A).

In a fifth aspect, the radio-frequency module (1) according to any one of the first to fourth aspects is as follows. The shield layer (33) has a plurality of surface portions (331 to 335) with which the outer surface of the resin layer (32A) is covered. The conductor (401) is in contact with one of the plurality of surface portions (331 to 335) other than another one of the plurality of surface portions (331 to 335) that is closer to the second filter (e.g., 7D) than to the first filter (e.g., 7A).

When the shield layer (33) has the plurality of surface portions (331 to 335) (i.e., when the first main surface (35) of the mounting substrate (30) has a polygonal shape), the aforementioned effect will be produced; that is, the present disclosure eliminates or reduces the possibility that the characteristics of each of the first filter (7A) and the second filter (7D) will deteriorate.

In a sixth aspect, the radio-frequency module (1) according to the fifth aspect is as follows. The plurality of surface portions (331 to 335) include a plurality of side surfaces (332 to 335) of the shield layer (33). The conductor (e.g., 401) is in contact with one of the plurality of side surfaces (332 to 335) that is closer than the other ones of the plurality of side surfaces to the first filter (e.g., 7A).

This feature enables the minimization of the length of the conductor (e.g., 401) serving as the heat dissipation path for the first filter (e.g., 7A). The heat dissipation properties of the first filter (e.g., 7A) will be improved accordingly.

In a seventh aspect, the radio-frequency module (1) according to the fifth or sixth aspect is as follows: the conductor (e.g., 401) is in contact with two or more of the plurality of surface portions (331 to 335) of the shield layer (33).

This feature yields an improvement in the heat dissipation properties of the first filter (e.g., 7A).

In an eighth aspect, the radio-frequency module (1) according to any one of the fifth to seventh aspects is as follows. The plurality of surface portions (331 to 335) include a plurality of side surfaces (332 to 335) of the shield layer (33). The first main surface (35) of the mounting substrate (30) has a corner (35s). The first filter (e.g., 7D) is disposed at the corner (35s) of the first main surface (35) of the mounting substrate (30). The conductor (e.g., 404) extends along the corner (35s) of the first main surface (35) of the mounting substrate (30) and is in contact with two of the plurality of side surfaces (332 to 335) of the shield layer (33). The two side surfaces (e.g., 333 and 335) meet at the corner (35s).

The conductor (e.g., 404) given as above provides the following effect: with the shield layer (33) having the side surfaces (332 to 335), the first filter (e.g., 7D) disposed at the corner (35s) of the first main surface (35) of the mounting substrate (30) is effectively in contact with the two side surfaces (e.g., 333 and 335) that meet at the corner (35s). The heat dissipation properties of the first filter (e.g., 7D) will be improved accordingly.

In a ninth aspect, the radio-frequency module (1) according to the eighth aspect is as follows: the conductor (404) extends along the two side surfaces (e.g., 333 and 335) when viewed in plan in a thickness direction (D1) of the mounting substrate (30).

The conductor (404) given as above has a contact region extending along the outline (e.g., the L-shape) of the corner (35s).

In a tenth aspect, the radio-frequency module (1) according to any one of the first to ninth aspects is as follows. A signal line (e.g., 81) through which a transmission signal or a reception signal flows is disposed in the mounting substrate (30) and/or on the second main surface (36) of the mounting substrate (30). The signal line (e.g., 81) at least partially overlaps the conductor (e.g., 402) when viewed in plan in a thickness direction (D1) of the mounting substrate (30).

With this placement, the first filter (e.g., 7B) and the signal line (e.g., 81) are electromagnetically shielded from each other by the conductor (e.g., 402). More specifically, the conductor (402) eliminates or reduces the possibility that electromagnetic noise produced in the signal line (81) will come into the conductor (402) (i.e., into the first filter (7B)). The conductor (402) also eliminates or reduces the possibility that electromagnetic noise produced in the first filter (7B) will come into the signal line (81).

In an eleventh aspect, the radio-frequency module (1) according to any one of the first to tenth aspects is as follows. The conductor (404) includes a conductor main body (49) and a partition member (56 or 55) that is electrically conductive. The conductor main body (49) is disposed on the first main surface (35) of the mounting substrate (30) and is in contact with the first filter (7A). The partition member (56 or 55) is disposed on the first main surface (35) of the mounting substrate (30) and is in contact with the conductor main body (49) and the shield layer (33).

This feature provides the following effects. Although a surface (e.g., a top surface) of the first filter (e.g., 7D) is not in contact with a surface (e.g., a top surface (331)) of the shield layer (33), heat generated by the first filter (7D) is dissipated through the surface (e.g., the top surface (331)) of the shield layer (33). With the addition of the conductor main body (49) to the already-existing partition member (56 or 55), that is, with such structural simplicity, the heat generated by the first filter (7D) is dissipated through the surface (e.g., the top surface (331)) of the shield layer (33).

In a twelfth aspect, the radio-frequency module (1) according to the eleventh aspect is as follows. The conductor (404) is a first conductor (404). The partition member (55) has an internal accommodation part (555) in which a circuit board (53) populated with electronic components is placed. The circuit board (53) is in contact with the partition member (55) with a second conductor (54) being disposed between the circuit board (53) and the partition member (55) and being disposed on a bottom surface of the partition member (55) (i.e., a front surface (551a) of a substrate (551) of the partition member (55)).

This feature provides the following effect: heat generated by the circuit board (53) placed in the internal space defined by the partition member (55) is dissipated through the second conductor (54), the partition member (55) and is then dissipated through the top surface (331) of the shield layer (33).

In a thirteenth aspect, the radio-frequency module (1) according to any one of the first to twelfth aspects is as follows. The conductor (401) is a first conductor (401). The radio-frequency module (1) further includes a third filter (7C), a second conductor (402), and a third conductor (403). The third filter (7C) is mounted on the first main surface (35) of the mounting substrate (30). The third filter (7C) is a filter whose passband is a third frequency band. The second conductor (402) is disposed on the first main surface (35) of the mounting substrate (30) and is in contact with the second filter (7B) and the mounting substrate (30). The third conductor (403) is mounted on the first main surface (35) of the mounting substrate (30) and is in contact with the third filter (7C) and the mounting substrate (30). The first filter (7A), the second filter (7B), and the third filter (7C) are each at least partially covered with the resin layer (32A). The radio-frequency module (1) is capable of performing simultaneous transmission by using the first filter (7A), the second filter (7B), and the third filter (7C). The first conductor (401) is in contact with the shield layer (33) on a side other than a side closer to the second filter (7B) and the third filter (7C) than to the first filter (7A). The second conductor (402) is in contact with the shield layer (33) on a side other than sides closer respectively to the first filter (7A) and the third filter (7C) than to the second filter (7B). The third conductor (403) is in contact with the shield layer (33) on a side other than a side closer to the first filter (7A) and the second filter (7B) than to the third filter (7C).

With this feature, the present disclosure is applicable to the first to third filters (7A to 7C) that are used for simultaneous transmission. This yields an improvement in the thermal dissipation properties of each of the first to third filters (7A to 7C) that are used for simultaneous transmission.

In a fourteenth aspect, a communication device (100) includes the radio-frequency module (1) according to any one of the first to thirteenth aspects and a signal processing circuit (2). The signal processing circuit (2) is connected to the radio-frequency module (1) and is configured to process a radio-frequency signal.

With this configuration, the communication device (100) including the radio-frequency module (1) is capable of producing the aforementioned effects.

REFERENCE SIGNS LIST 1 radio-frequency module
2 signal processing circuit 3A to 3C antenna
5A power amplifier (first power amplifier)
5B power amplifier (second power amplifier)
6A to 6D low-noise amplifier
7A transmitting filter (first filter, second filter)
7B transmitting filter (first filter, second filter)
7C transmitting filter (third filter)
7D transmitting filter (first filter, second filter)
8A to 8B receiving filter
10A, 10B output matching circuit
11A to 11D, 12A to 12C matching circuit
14 first switch
14a to 14c common terminal
14d to 14k selection terminal
15 second switch
15a common terminal
15b to 15d selection terminal
16 third switch
16a to 16c common terminal
16d to 16g selection terminal
17 controller
18A to 19j external connection terminal
21 baseband signal processing circuit
22 RF signal processing circuit
30 mounting substrate (first substrate)
31 circuit component
32A first resin layer
32B second resin layer
33 shield layer
35 first main surface
35L first half region
35R second half region
35s corner
36 second main surface
401 conductor (first conductor)
402 conductor (second conductor)
403 conductor (third conductor)
404 conductor (first conductor)
501 conductor
41 connection member
49 conductor main body
50 first extension
51 second extension
53 circuit board (substrate)
54 conductor (second conductor)
55, 56 partition member
55a, 56a top surface
71 support substrate
71a, 71b main surface
71c IDT electrode
71d pad electrode
72 spacer layer
73 cover member
74 through-via electrode
75 connection terminal
81 to 83 signal line
100 communication device
331 top surface
331 to 335 surface portion
332 to 335 side surface
404a to 404c constituent conductor
404d extension
551 substrate
551a front surface
552 shield wall
552a top surface
553 connection member
555 internal accommodation part
556 connection member
D1 first direction (thickness direction)
D2 second direction
D3 third direction
Q1 to Q3 heat
R1 to R4, T1 to T4 signal path
Tc common path
T21, T31, T41 individual path

The invention claimed is:

1. A radio-frequency module, comprising:
a mounting substrate comprising a first main surface and a second main surface on opposite sides;
a first filter on the first main surface of the mounting substrate, the first filter comprising a filter including a passband that comprises a first frequency band;
a second filter on the first main surface of the mounting substrate, the second filter comprises a filter including a passband that comprises a second frequency band;
a resin layer on the first main surface of the mounting substrate, the first and second filters being at least partially covered with the resin layer;
a shield layer on an outer surface of the resin layer; and
a conductor on the first main surface of the mounting substrate and being in contact with the first filter and the mounting substrate, wherein
the radio-frequency module is configured to perform simultaneous transmission that utilizes both the first filter and the second filter, and
the conductor is in contact with the shield layer on a side different than a side closer to the second filter than to the first filter.

2. The radio-frequency module according to claim 1, further comprising:
a first power amplifier connected to the first filter; and
a second power amplifier connected to the second filter.

3. The radio-frequency module according to claim 2, wherein a first maximum power output of the first power amplifier is greater than a second maximum power output of the second power amplifier.

4. The radio-frequency module according to claim 3, wherein
the first filter comprises an acoustic wave filter,
the first filter includes an interdigital transducer (IDT) electrode and a support substrate that is configured to support the IDT electrode, and
the first filter is on the mounting substrate with the support substrate between the mounting substrate and the IDT electrode.

5. The radio-frequency module according to claim 3, wherein
the shield layer comprises a plurality of surface portions with which the outer surface of the resin layer is covered, and
the conductor is in contact with a first of the plurality of surface portions other than a second of the plurality of surface portions that is closer to the second filter than to the first filter.

6. The radio-frequency module according to claim 2, wherein
the first filter comprises an acoustic wave filter,
the first filter includes an interdigital transducer (IDT) electrode and a support substrate that is configured to support the IDT electrode, and
the first filter is on the mounting substrate with the support substrate between the mounting substrate and the IDT electrode.

7. The radio-frequency module according to claim 2, wherein
the shield layer comprises a plurality of surface portions with which the outer surface of the resin layer is covered, and
the conductor is in contact with a first of the plurality of surface portions other than a second of the plurality of surface portions that is closer to the second filter than to the first filter.

8. The radio-frequency module according to claim 7, wherein
the plurality of surface portions comprise a plurality of side surfaces of the shield layer, and
the conductor is in contact with one of the plurality of side surfaces that is closer than the other ones of the plurality of side surfaces to the first filter.

9. The radio-frequency module according to claim 1, wherein
the first filter comprises an acoustic wave filter,
the first filter includes an interdigital transducer (IDT) electrode and a support substrate that is configured to support the IDT electrode, and
the first filter is on the mounting substrate with the support substrate between the mounting substrate and the IDT electrode.

10. The radio-frequency module according to claim 9, wherein
the shield layer comprises a plurality of surface portions with which the outer surface of the resin layer is covered, and
the conductor is in contact with a first of the plurality of surface portions other than a second of the plurality of surface portions that is closer to the second filter than to the first filter.

11. The radio-frequency module according to claim 1, wherein
the shield layer comprises a plurality of surface portions with which the outer surface of the resin layer is covered, and
the conductor is in contact with a first of the plurality of surface portions other than a second of the plurality of surface portions that is closer to the second filter than to the first filter.

12. The radio-frequency module according to claim 11, wherein
the plurality of surface portions comprise a plurality of side surfaces of the shield layer, and
the conductor is in contact with one of the plurality of side surfaces that is closer than the other ones of the plurality of side surfaces to the first filter.

13. The radio-frequency module according to claim 11, wherein the conductor is in contact with two or more of the plurality of surface portions of the shield layer.

14. The radio-frequency module according to claim 11, wherein
the plurality of surface portions comprise a plurality of side surfaces of the shield layer,
the first main surface of the mounting substrate comprises a corner,
the first filter is at the corner of the first main surface of the mounting substrate, and
the conductor extends along the corner of the first main surface of the mounting substrate and is in contact with two of the plurality of side surfaces of the shield layer, with the two side surfaces meeting at the corner.

15. The radio-frequency module according to claim 14, wherein the conductor extends along the two side surfaces when viewed in plan in a thickness direction of the mounting substrate.

16. The radio-frequency module according to claim 1, wherein
a signal line, through which a transmission signal or a reception signal flows, is in the mounting substrate and/or on the second main surface of the mounting substrate, and
the signal line at least partially overlaps the conductor when viewed in plan in a thickness direction of the mounting substrate.

17. The radio-frequency module according to claim 1, wherein
the conductor comprises:
a conductor main body on the first main surface of the mounting substrate and being in contact with the first filter, and
a partition member on the first main surface of the mounting substrate and being in contact with the conductor main body and the shield layer, the partition member being electrically conductive.

18. The radio-frequency module according to claim 17, wherein
the conductor comprises a first conductor,
the partition member comprises an internal accommodation part that comprises a circuit board that includes one or more electronic components, and
the circuit board is in contact with the partition member with a second conductor being between the circuit board and the second conductor and being on a bottom surface of the partition member.

19. The radio-frequency module according to claim 1, wherein
the conductor comprises a first conductor,
the radio-frequency module further comprises:
a third filter on the first main surface of the mounting substrate, the third filter comprising a filter including a passband that comprises a third frequency band,
a second conductor on the first main surface of the mounting substrate and being in contact with the second filter and the mounting substrate, and
a third conductor on the first main surface of the mounting substrate and being in contact with the third filter and the mounting substrate,
the first filter, the second filter, and the third filter are each at least partially covered with the resin layer,
the radio-frequency module is further configured to perform simultaneous transmission by utilizing the first filter, the second filter, and the third filter,
the first conductor is in contact with the shield layer on a side different than a side closer to the second filter and the third filter than to the first filter,
the second conductor is in contact with the shield layer on a side different than sides closer respectively to the first filter and the third filter than to the second filter, and
the third conductor is in contact with the shield layer on a side different than a side closer to the first filter and the second filter than to the third filter.

20. A communication device, comprising:
the radio-frequency module according to claim 1; and
a signal processing circuit connected to the radio-frequency module and configured to process a radio-frequency signal.

* * * * *